US012802638B2

(12) United States Patent
Kim et al.

(10) Patent No.: US 12,802,638 B2
(45) Date of Patent: Nov. 17, 2026

(54) DISPLAY DEVICE

(71) Applicant: LG Display Co., Ltd., Seoul (KR)

(72) Inventors: Binn Kim, Paju-si (KR); JaeHee Park, Paju-si (KR); JongSung Kim, Paju-si (KR); Hoiyong Kwon, Paju-si (KR); Sunghee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/058,807

(22) Filed: Feb. 20, 2025

(65) Prior Publication Data

US 2025/0279054 A1 Sep. 4, 2025

(30) Foreign Application Priority Data

Feb. 29, 2024 (KR) ........................ 10-2024-0030223
Aug. 26, 2024 (KR) ........................ 10-2024-0114056

(51) Int. Cl.

*G09G 3/3233* (2016.01)
*G09G 3/00* (2006.01)
*H10K 59/131* (2023.01)

(52) U.S. Cl.

CPC ........... *G09G 3/3233* (2013.01); *G09G 3/006* (2013.01); *H10K 59/131* (2023.02); *G09G 2300/0426* (2013.01); *G09G 2300/0819* (2013.01); *G09G 2300/0852* (2013.01); *G09G 2310/08* (2013.01); *G09G 2320/0233* (2013.01); *G09G 2330/08* (2013.01); *G09G 2330/10* (2013.01); *G09G 2330/12* (2013.01)

(58) Field of Classification Search

CPC ..... G09G 3/3233; G09G 3/006; H10K 59/131
See application file for complete search history.

(56) References Cited

U.S. PATENT DOCUMENTS

| | | | | |
|---|---|---|---|---|
| 9,728,595 | B2 | 8/2017 | Park et al. | |
| 2016/0118454 | A1 | 4/2016 | Park et al. | |
| 2017/0125496 | A1* | 5/2017 | Oh | H10K 59/353 |
| 2020/0193902 | A1* | 6/2020 | Hsu | G09G 3/3406 |
| 2020/0211449 | A1* | 7/2020 | Kim | G09G 3/3233 |
| 2021/0202680 | A1* | 7/2021 | Shin | G09G 3/2092 |
| 2022/0149128 | A1* | 5/2022 | Shim | H10K 59/80515 |
| 2022/0310008 | A1 | 9/2022 | Jin | |
| 2023/0207735 | A1* | 6/2023 | Choi | H10K 59/1315 257/79 |
| 2023/0238487 | A1 | 7/2023 | Hwang et al. | |
| 2024/0138198 | A1* | 4/2024 | Lee | H10K 59/121 |

FOREIGN PATENT DOCUMENTS

| | | | |
|---|---|---|---|
| CN | 111462671 | A | 7/2020 |
| KR | 10-2245304 | B1 | 4/2021 |
| TW | 202338776 | A | 10/2023 |

OTHER PUBLICATIONS

Taiwan Intellectual Property Office, Office Action, Taiwanese Patent Application No. 114107511, Feb. 10, 2026, 14 pages.

* cited by examiner

*Primary Examiner* — Sardis F Azongha
(74) *Attorney, Agent, or Firm* — Fenwick & West LLP

(57) ABSTRACT

A display device is provided, one sub-pixel including a first light emitting device that receives a first low-potential voltage and a second light emitting device that receives a second low-potential voltage. In addition, a display device is provided, wherein in one sub-pixel, first electrodes of first and second light emitting devices are connected with one and a same thin film transistor, and second electrodes of the first and second light emitting devices are spaced apart.

27 Claims, 14 Drawing Sheets

500 : 510, 520, 530, 540

130: 131, 132
140: 141, 142
150: 151, 152
160: 161, 162, 163
190: 191, 192

DISPLAY DEVICE

CROSS-REFERENCE TO RELATED APPLICATIONS

This application claims the benefit of the Republic of Korea Patent Application No. 10-2024-0030223 filed on Feb. 29, 2024 and the Republic of Korea Patent Application No. 10-2024-0114056 filed on Aug. 26, 2024, each of which is hereby incorporated by reference in its entirety.

BACKGROUND

Field of Technology

The present disclosure relates to a display device.

Description of the Related Art

The display device is widely used as a display screen of a notebook computer, a tablet computer, a smart phone, a portable display device, and a portable information device in addition to a display screen of a television or a monitor. With the advancement of technology, a display device may provide photographing or various sensing functions in addition to an image display function. Accordingly, the display device may include an electronic device such as a camera or a sensor.

Among the display devices, an organic light emitting display device is a self-emission type, and has advantages such as superior viewing angle and contrast ratio. Compared to a liquid crystal display (LCD), light weight and thinness are possible because no separate backlight is required, and power consumption is advantageous. In addition, the organic light emitting display device has an advantage of being able to be driven by direct current (DC) low voltage, fast response speed, and especially low manufacturing cost.

The description provided in the background section should not be assumed to be prior art merely because it is mentioned in or associated with the background section. The background section may include information that describes one or more aspects of the subject technology.

SUMMARY

In the process of forming a light emitting device of the organic light emitting display device, external particle may penetrate. Specifically, the light emitting device may be formed by sequentially depositing an anode, a light emitting layer, and a cathode. When particle penetrating from the outside is seated on the anode, the light emitting layer cannot be stably formed on the anode. Likewise, the cathode cannot be stably formed on the light emitting layer. In this case, the cathode and the anode may contact with each other, resulting in a short circuit. Since the light emitting device in which the short circuit has occurred cannot emit light, a defective pixel including a dark spot may occur.

Recently, through an aging process, dark spots are removed to normalize defective pixels. However, dark spots may occur again in normalized pixels, and there is still a problem that many dark spots occur.

The present disclosure has been made in view of the above problems and it is an aspect of the present disclosure to provide a display device with a reduced probability of dark spots.

In accordance with an aspect of the present disclosure, the above and other technical effects can be accomplished by the provision of a display device comprising a display panel including a display area on which a plurality of sub-pixels are disposed, and a low-potential voltage supply unit supplying a first low-potential voltage and a second low-potential voltage to the plurality of sub-pixels, wherein each of the plurality of sub-pixels includes a first light emitting unit including a first light emitting device and a second light emitting unit including a second light emitting device, the first light emitting device receives the first low-potential voltage through a first low-potential voltage line, and the second light emitting device receives the second low-potential voltage through a second low-potential voltage line.

In addition, in accordance with an aspect of the present disclosure, the above and other aspects can be accomplished by the provision of a display device comprising a substrate including a plurality of low-potential lines and a plurality of sub-pixels, wherein each of the plurality of sub-pixels includes a thin film transistor disposed on the substrate, a planarization layer disposed on the thin film transistor, the planarization layer having an opening, and a first light emitting device and a second light emitting device disposed on the planarization layer, a first electrode of the first light emitting device and a first electrode of the second light emitting device are connected with one same thin film transistor, and a second electrode of the first light emitting device and a second electrode of the second light emitting device are spaced apart from each other.

It is to be understood that both the foregoing general description and the following detailed description are exemplary and explanatory and are intended to provide further explanation of the inventive concepts as claimed

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

Figure 1:
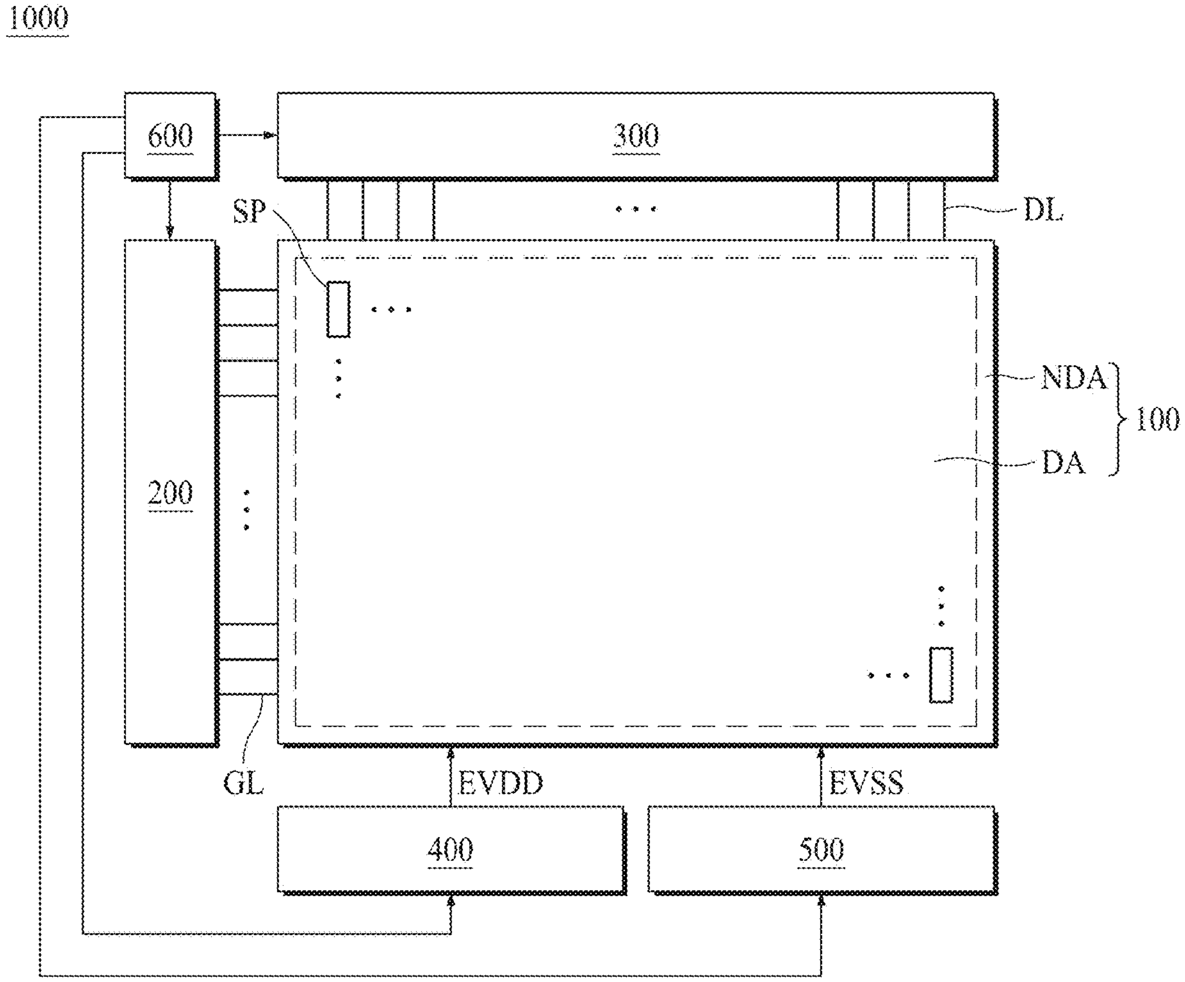
FIG. 1 is a schematic block diagram of a display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience

DETAILED DESCRIPTION

Reference will now be made in detail to embodiments of the present disclosure, examples of which may be illustrated in the accompanying drawings. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations may be selected only for convenience of writing the specification and may be thus different from those used in actual products.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another portion may be added unless 'only~' is used. The terms of a singular form may include plural forms unless referred to the contrary.

The word "exemplary" is used to mean serving as an example or illustration. Aspects are example aspects. "Embodiments," "examples," "aspects," and the like should not be construed as preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In construing an element, the element is construed as including an error band although there is no explicit description. Any implementation described herein as an "example" is not necessarily to be construed as preferred or advantageous over other implementations.

In describing a position relationship, for example, when the position relationship is described as 'upon~', 'above~', 'below~' and 'next to~', one or more portions may be disposed between two other portions unless 'just' or 'direct' is used. The terms, such as "below," "lower," "above," "upper" and the like, may be used herein to describe a relationship between element(s) as illustrated in the drawings. It will be understood that the terms are spatially relative and based on the orientation depicted in the drawings.

It will be understood that, although the terms "first," "second," "A," "B," "(a)," and "(b)" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first element, a second element, and a third element" compasses the combination of all three listed elements, combinations of any two of the three elements, as well as each individual element, the first element, the second element, or the third element.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in a co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, one embodiment of the present disclosure will be described in detail with reference to the accompanying drawings.

FIG. 1 is a schematic plan view of a display device 1000 according to an embodiment of the present invention.

Referring to FIG. 1, the display device 1000 according to an embodiment of the present disclosure may include a display panel 100, a gate driver 200, a data driver 300, a high-potential voltage driver 400, a low-potential voltage driver 500, and a timing controller 600.

The display panel 100 may include a display area DA and a non-display area NDA extending from the display area DA. As an example, the non-display area NDA may fully or partially surround the display area DA. The display area DA is an area in which an image may be displayed, and the non-display area NDA is an area in which an image is not displayed.

A plurality of sub-pixels SP and a plurality of signal lines for driving the plurality of sub-pixels SP may be disposed in the display area DA. The plurality of signal lines may include a plurality of data lines DL and a plurality of gate lines GL.

The gate driver 200 is a circuit configured to drive the plurality of gate lines GL, and may output scan signals to the plurality of gate lines GL.

The data driver 300 is a circuit configured to drive the plurality of data lines DL, and may output data signals to the plurality of data lines DL.

The high-potential voltage driver 400 may supply a high-potential voltage EVDD to the plurality of sub-pixels SP.

The low-potential voltage driver 500 may supply the low-potential voltage EVSS to the plurality of sub-pixels SP.

The timing controller 600 may supply various control signals for controlling the gate driver 200, the data driver 300, the high potential voltage driver 400, and the low-potential voltage driver 500. Embodiments are not limited thereto. As an example, at least one of the above-mentioned components may be omitted depending on the design. As an example, two or more above-mentioned components may be combined into one component. As an example, one or more additional component may be further included.

Figure 2:
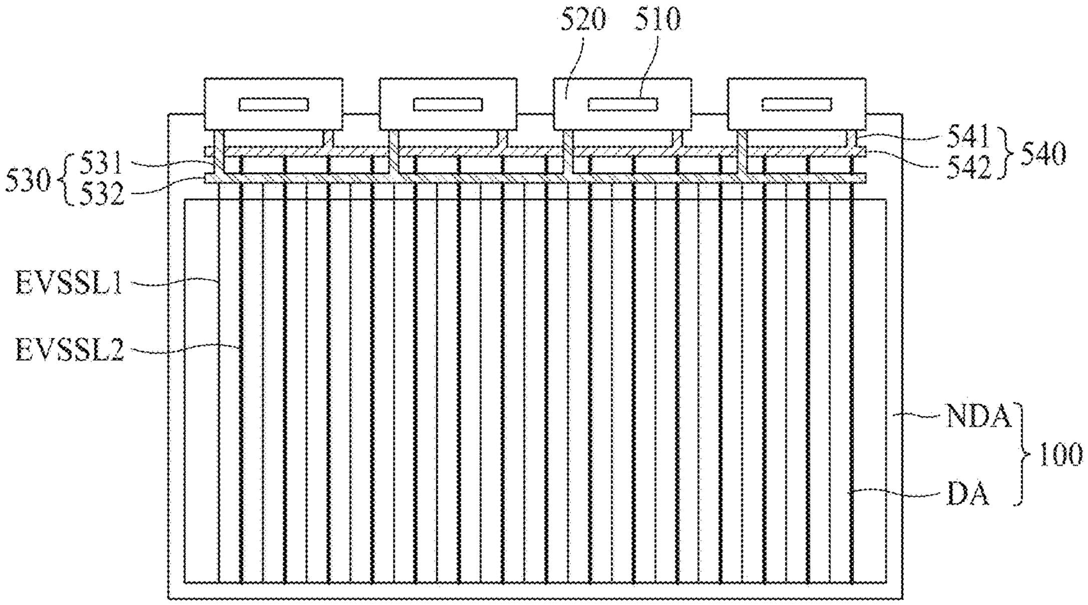
FIG. 2 is a plan view of a display device according to an embodiment of the present disclosure.

FIG. 2 is a plan view of the display device 1000 according to an embodiment of the present disclosure.

Referring to FIG. 2, the display device 1000 may include a display panel 100 and a low-potential voltage driver 500.

As described above, the display panel 100 may include the display area DA and the non-display area NDA surrounding the display area DA.

The low-potential voltage driver 500 (e.g., a circuit) may include a plurality of driving ICs 510, a plurality of flexible circuit boards 520, a first shorting bar 530, and a second shorting bar 540.

Each of the plurality of driving ICs 510 may be mounted on the flexible circuit board 520. Also, the flexible circuit board 520 may include a plurality of wirings, and may electrically connect the plurality of driving ICs 510 with the display panel 100.

The first shorting bar 530 may include a plurality of first connection parts 531 and a second connection part 532.

One side of each of a plurality of first connection parts 531 may be connected with the plurality of driving ICs 510, and the other side of the first connection parts 531 may be connected with the second connection parts 532. That is, the first shorting bar 530 may have a shape in which the plurality of first connection parts 531 protrude from one side of the second connection parts 532 toward the plurality of driving ICs 510. In addition, one side of the second connection part 532 may be connected with the plurality of first connection parts 531, and the other side of the second connection part 532 may be connected with the plurality of first low-potential voltage lines EVSSL1.

Likewise, the second shorting bar 540 may include a plurality of first connection parts 541 and a second connection part and 542. Also, the second shorting bar 540 may not be electrically connected with the first shorting bar 530.

One side of each of the plurality of first connection parts 541 may be connected to the plurality of driving ICs 510, and the other side of the first connection parts 541 may be connected with the second connection part 542. That is, the second shorting bar 540 may have a shape in which the plurality of first connection parts 541 protrude from one side of the second connection part 542 toward the plurality of driving ICs 510. Also, one side of the second connection part 542 may be connected with the plurality of first connection parts 541, and the other side of the second connection part 542 may be connected with a plurality of second low-potential voltage lines EVSSL2.

A plurality of low-potential voltage lines EVSSL may be disposed in the display area DA of the display panel 100. Although not shown in FIG. 2, the plurality of low-potential voltage lines EVSSL may be connected with the plurality of sub-pixels SP disposed in the display area DA. Accordingly, the low-potential voltage driver 500 may supply the low-potential voltage EVSS to the plurality of sub-pixels SP through the plurality of low-potential voltage lines EVSSL.

The plurality of low-potential voltage lines EVSSL may include the plurality of first low-potential voltage lines EVSSL1 and the plurality of second low-potential lines EVSSL2. Each of the plurality of sub-pixels SP may be electrically connected with both the first and second low-potential voltage lines EVSSL1 and EVSSL2.

In the display panel 100, the first and second low-potential voltage lines EVSSL1 and EVSSL2 may be alternately disposed. Specifically, the low-potential voltage line EVSSL disposed in an odd number from an end of the display panel 100 may be the first low-potential voltage line EVSSL1, and the low-potential voltage line EVSSL disposed in an even number from the end of the display panel 100 may be the second low-potential voltage line EVSSL2. Embodiments are not limited thereto. As an example, the low-potential voltage line EVSSL disposed in an even number from an end of the display panel 100 may be the first low-potential voltage line EVSSL1, and the low-potential voltage line EVSSL disposed in an odd number from the end of the display panel 100 may be the second low-potential voltage line EVSSL2, without being limited thereto.

The low-potential voltage driver 500 may apply the first low-potential voltage EVSS1 to the first low-potential voltage line EVSSL1 through the first shorting bar 530. Also, the low-potential voltage driver 500 may apply the second low-potential voltage EVSS2 to the second low-potential voltage line EVSSL2 through the second shorting bar 540. Also, a magnitude of the first low-potential voltage EVSS1 may be the same as a magnitude of the second low-potential voltage EVSS2, but is not limited thereto.

Figure 3:
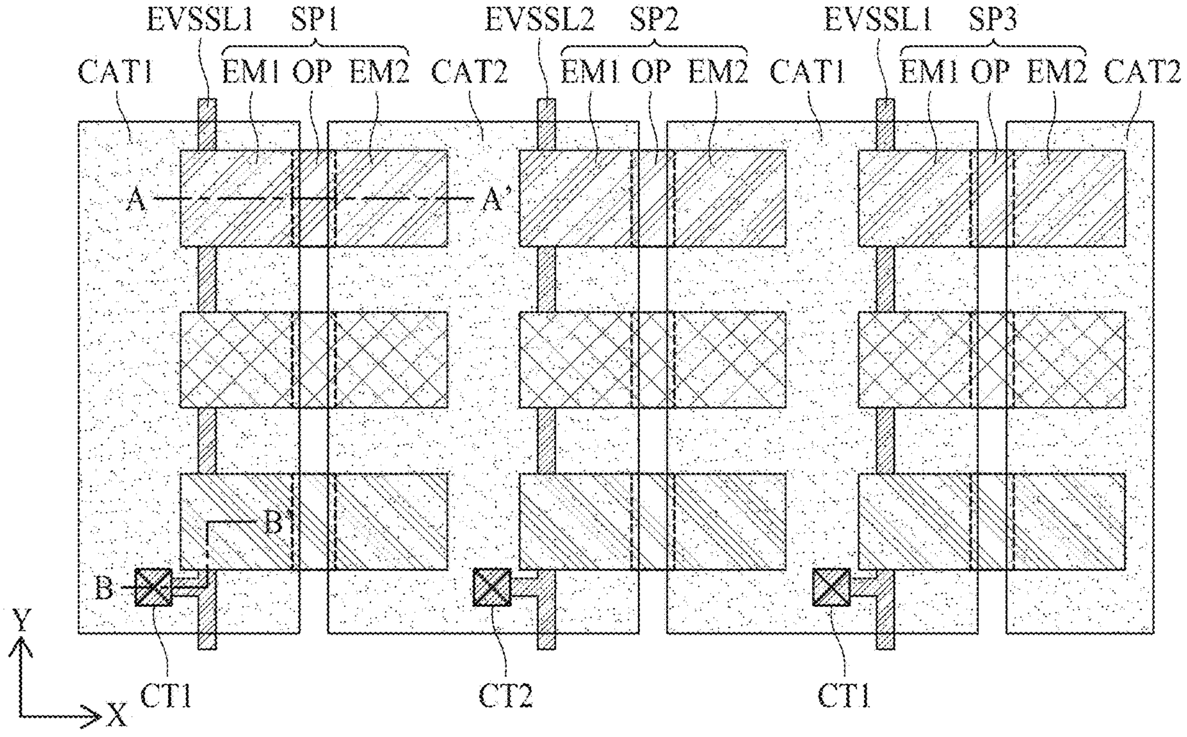
FIG. 3 is a plan view of a display panel according to an embodiment of the present disclosure.

FIG. 3 is a plan view of the display panel 100 according to an embodiment of the present disclosure. Specifically, FIG. 3 illustrates an arrangement of the plurality of sub-pixels SP and the low-potential voltage line EVSSL disposed on the display panel 100.

Referring to FIG. 3, the display panel 100 according to an embodiment of the present invention may include the plurality of sub-pixels SP. The plurality of sub-pixels SP may be disposed in a matrix structure arranged along a first direction and a second direction X and Y. Each of the plurality of sub-pixels SP may emit any one of red, green, blue, and white light, without being limited thereto. As an example, at least one of the plurality of sub-pixels SP may emit light of a color other than red, green, blue, and white (e.g., cyan, magenta, or yellow, etc). Although FIG. 3 illustrates that sub-pixels arranged along the first direction X emit light of the same color, it is not limited thereto. As an example, the sub-pixels arranged along the first direction X emit light of different colors.

A first low-potential voltage line and a second low-potential voltage line EVSSL1 and EVSSL2 are disposed below the plurality of sub-pixels SP, and the plurality of sub-pixels SP may overlap the first and second low-potential voltage lines EVSSL1 and EVSSL2. Embodiments are not limited thereto. As an example, at least one or all of the plurality of sub-pixels SP may not overlap at least one of the first and second low-potential voltage lines EVSSL1 and EVSSL2. Also, each of the first and second low-potential voltage lines EVSSL1 and EVSSL2 may extend in the second direction Y. That is, one low-potential voltage line EVSSL may overlap a plurality of sub-pixels SP. As an example, one low-potential voltage line EVSSL may overlap the plurality of sub-pixels SP that emit light of different colors, or may overlap the plurality of sub-pixels SP that emit light of the same colors. Also, although FIG. 3 illustrates that the first and second low-potential voltage lines EVSSL1 and EVSSL2 are disposed adjacent to a left end of the sub-pixel SP, it is not limited thereto. For example, the first and second low-potential voltage lines EVSSL1 and EVSSL2 may be disposed adjacent to a right end of the sub-pixel SP, may be disposed at the center portion of the sub-pixel SP, or may be disposed at an outer portion of the sub-pixel SP, without being limited thereto.

One sub-pixel SP may include a first light emitting part EM1, a second light emitting part EM2, and an opening OP. Each of the first and second light emitting parts EM1 and EM2 includes a light emitting device and may emit light. Also, the first and second light emitting parts EM1 and EM2 may emit light of a same color. The opening OP may be disposed between the first and second light emitting parts EM1 and EM2, and may separate the first light emitting part EM1 and the second light emitting part EM2 from each other. Also, the opening OP may not include a light emitting device.

One sub-pixel SP may receive first and second low-potential voltages EVSS1 and EVSS2 from the first and second low-potential voltage lines EVSSL1 and EVSSL2. Also, one sub-pixel SP may overlap one of the first and second low-potential voltage lines EVSSL1 and EVSSL2 and may be spaced apart from the other of the first and second low-potential voltage lines EVSSL1 and EVSSL2.

For example, the first sub-pixel SP1 may overlap the first low-potential voltage line EVSSL1 and may be spaced apart from the second low-potential voltage line EVSSL2. For example, the first sub-pixel SP1 may not overlap the second low-potential voltage line EVSSL2. Also, the second sub-pixel SP2 may overlap the second low-potential voltage line EVSSL2 and may be spaced apart from the first low-potential voltage line EVSSL1. For example, the second sub-pixel SP2 may not overlap first low-potential voltage line EVSSL1. Also, the third sub-pixel SP3 may overlap the first low-potential voltage line EVSSL1 and may be spaced apart from the second low-potential voltage line EVSSL2. For example, the third sub-pixel SP3 may not overlap the second low-potential voltage line EVSSL2. That is, the sub-pixel SP overlapping the first low-potential voltage line EVSSL1 and the sub-pixel SP overlapping the second low-potential voltage line EVSSL2 may be alternately disposed.

The first light emitting part EM1 of the first sub-pixel SP1 may overlap the first low-potential voltage line EVSSL1, and the second light emitting part EM2 of the first sub-pixel SP1 may be spaced apart from the first and second low-potential voltage lines EVSSL1 and EVSSL2. For example, the second light emitting part EM2 of the first sub-pixel SP1 may not overlap the first and second low-potential voltage lines EVSSL1 and EVSSL2. In addition, the first light emitting part EM1 of the second sub-pixel SP2 may overlap the second low-potential voltage line EVSSL2, and the second light emitting part EM2 of the second sub-pixel SP2 may be spaced apart from the first and second low-potential voltage lines EVSSL1 and EVSSL2. For example, the second light emitting part EM2 of the second sub-pixel SP2 may not overlap the first and second low-potential voltage lines EVSSL1 and EVSSL2.

A cathode CAT may include a first cathode and a second cathode CAT1 and CAT2. The first cathode CAT1 may be disposed on the first low-potential voltage line EVSSL1. Also, the second cathode CAT2 may be disposed on the second low-potential voltage line EVSSL2. The first and second cathodes CAT1 and CAT2 may be spaced apart from each other in an area overlapping the opening OP. That is, the first and second cathodes CAT1 and CAT2 may not be electrically connected with each other. Embodiments are not limited thereto. As an example, the first cathode CAT1 may overlap or may not overlap the first low-potential voltage line EVSSL1, and the second cathode CAT2 may overlap or may not overlap the second low-potential voltage line EVSSL2, without being limited thereto.

The first low-potential voltage lines EVSSL1 may include a first contact portion CT1. As an example, the first contact portion CT1 may be formed to extend to one side of the first low-potential voltage lines EVSSL1, or may overlap the first low-potential voltage lines EVSSL1, without being limited thereto. The first low-potential voltage lines EVSSL1 may be electrically connected with the first cathode CAT1 through the first contact portion CT1. Also, the second low-potential voltage line EVSSL2 may include a second contact portion CT2. As an example, the second contact portion CT2 may be formed to extend to one side of the second low-potential voltage line EVSSL2, or may overlap the first low-potential voltage lines EVSSL1, without being limited thereto. The second low-potential voltage line EVSSL2 may be electrically connected with the second cathode CAT2 through the second contact portion CT2.

That is, one sub-pixel SP may include both the first cathode CAT1 receiving the first low-potential voltage EVSS1 from the first low-potential voltage line EVSSL1 and the second cathode CAT2 receiving the second low-potential voltage from the second low-potential voltage line EVSSL2. That is, the first and second light emitting parts EM1 and EM2 may receive the low-potential voltage from different lines.

Accordingly, the display panel 100 according to an embodiment of the present disclosure may automatically detect a repair target for a repair process by checking whether the light emitting part emits light. Specifically, it is possible to check whether the light-emitting part driven by any one of the first low-potential voltage line EVSSL1 and the second low-potential voltage line EVSSL2 emits light. For example, if the light emitting part driven by the first low-potential voltage line EVSSL1 normally emits light and the light emitting part driven by the second low-potential voltage line EVSSL2 does not emit light, it can be determined that the light emitting part connected to the second low-potential voltage line EVSSL2 has a defect.

The first and second cathodes CAT1 and CAT2 may include a conductive material. As an example, the first and second cathodes CAT1 and CAT2 may include a transparent conductive material such as an indium tin oxide (ITO) or an indium zinc oxide (IZO), or may include an opaque conductive material such as metal, without being limited thereto. Also, the first and second cathodes CAT1 and CAT2 may include the same material, but are not limited thereto.

Figure 4:
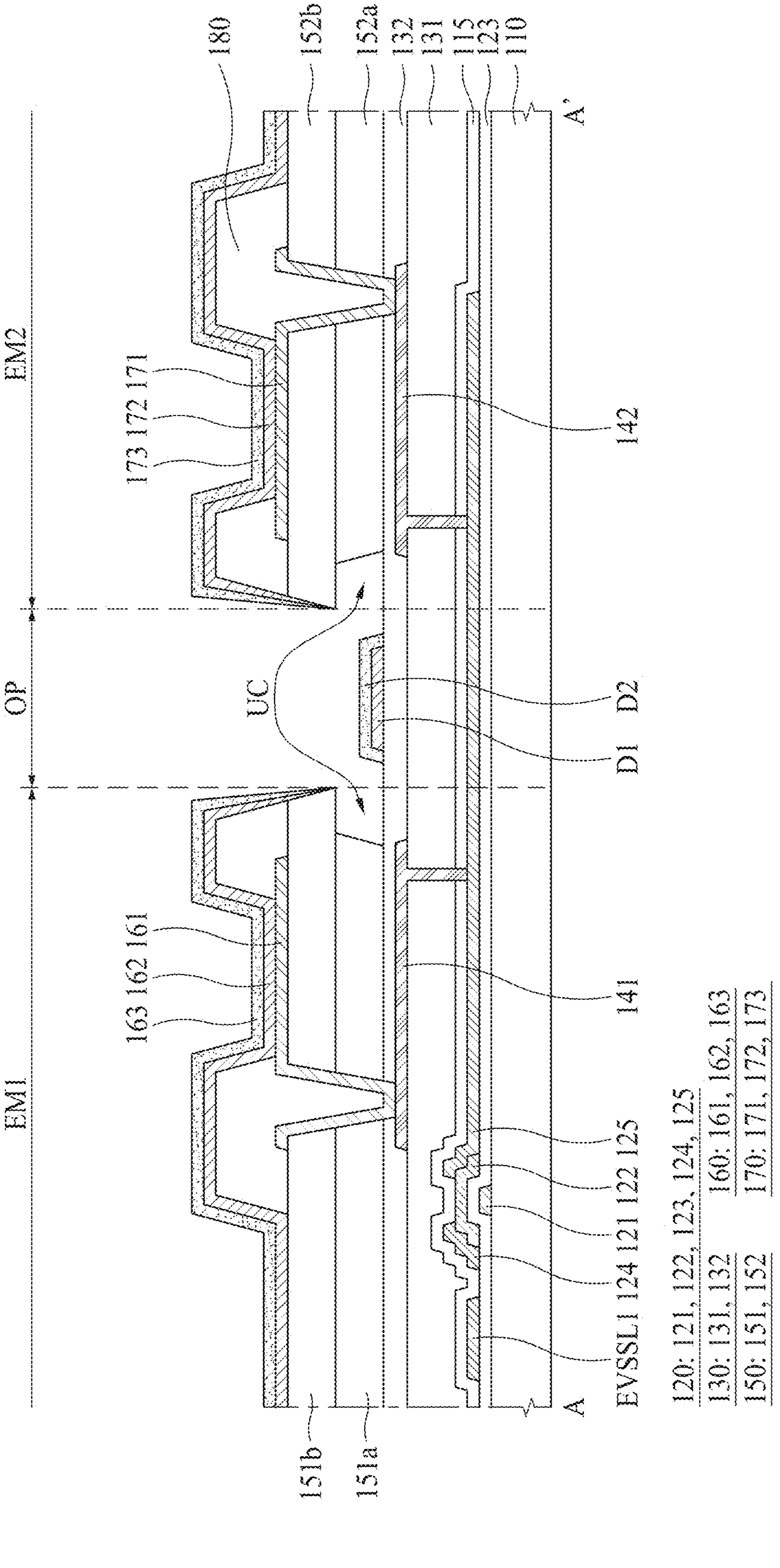
FIG. 4 is a cross-sectional view taken along the line A-A' of FIG. 3 according to an embodiment of the present disclosure.

FIG. 4 is a cross-sectional view taken along line A-A' of FIG. 3 according to one embodiment. That is, FIG. 4 is a cross-sectional view of one sub-pixel SP.

Referring to FIG. 4, one sub-pixel SP according to an embodiment of the present invention may include a substrate 110, an interlayer insulating layer 115, a thin film transistor 120, a passivation layer 130, a first connection electrode 141, a second connection electrode 142, a planarization layer 150, a first light emitting device 160, and a second light emitting device 170.

The substrate 110 may be made of glass, plastic, metal, or a flexible polymer film, but is not limited thereto. The display device according to an embodiment of the present invention may be configured in a top emission type in which the emitted light is emitted upward, a bottom emission type in which the emitted light is emitted downward, or a dual emission type. Accordingly, as the material of the substrate 110, not only a transparent material but also an opaque material may be used.

The thin film transistor 120 may be disposed on the substrate 110. The thin film transistor 120 may include a gate electrode 121, a semiconductor layer 122, a gate insulating layer 123, a source electrode 124, and a drain electrode 125. Although FIG. 4 illustrates that the thin film transistor 120 is disposed in the first light emitting part EM1, the present invention is not limited thereto. As an example, the thin film transistor 120 may be disposed in the opening OP or the second light emitting part EM2, without being limited thereto.

The gate electrode 121 of the thin film transistor 120 may be disposed on the substrate 110. Also, the semiconductor layer 122 may be disposed on the gate electrode 121. The semiconductor layer 122 may include a poly-silicon semiconductor, an oxide semiconductor, an amorphous silicon (a-Si) semiconductor, a compound semiconductor or an organic semiconductor, without being limited thereto. In addition, when the semiconductor layer 122 includes an oxide semiconductor, at least one oxide of indium-gallium-zinc-oxide (IGZO), indium-zinc-oxide (IZO), indium-gallium-tin-oxide (IGTO), and indium-gallium-oxide (IGO) may be included.

In order to insulate the gate electrode 121 from the semiconductor layer 122, a gate insulating layer 123 may be disposed between the gate electrode 121 and the semiconductor layer 122. The gate insulating layer 123 may include a single layer of silicon nitride (SiNx) or silicon oxide (SiOx) or multiple layers thereof. Also, FIG. 4 illustrates a bottom gate structure in which a semiconductor layer 122 is disposed on a gate electrode 121, but is not limited thereto. For example, a top gate structure in which the gate electrode 121 is disposed on the semiconductor layer 122 may be disclosed.

The source electrode 124 and the drain electrode 125 may be disposed on the semiconductor layer 122 while facing each other. Also, the first low-potential voltage line EVSSL1 may be disposed on the same layer as the source electrode 124 and the drain electrode 125. The source electrode 124, the drain electrode 125 and the first low-potential voltage line EVSSL1 may be formed by the same process. Embodiments are not limited thereto. As an example, the first low-potential voltage line EVSSL1 may be disposed on a different layer from the source electrode 124 and the drain electrode 125, and/or may be formed by a different process from the source electrode 124 and the drain electrode 125.

The interlayer insulating layer 115 may be disposed on the source electrode 124, the drain electrode 125, and the first low-potential voltage line EVSSL1. A contact hole exposing a portion of the drain electrode 125 may be formed in the interlayer insulating layer 115. Also, the interlayer insulating layer 115 may be formed of an inorganic insulating material, such as silicon oxide (SiOx), silicon nitride (SiNx), silicon oxynitride (SiOxNy).

The passivation layer 130 may be disposed on the thin film transistor 120 and may be disposed in the first and second light emitting parts EM1 and EM2 and the opening OP. Also, the passivation layer 130 may include a first passivation layer and a second passivation layer 131 and 132.

The first passivation layer 131 may be disposed on the thin film transistor 120, and the second passivation layer 132 may be disposed on the first passivation layer 131. The first and second passivation layers 131 and 132 may compensate for a step difference caused by the thin film transistor 120 to planarize the upper region of the thin film transistor 120. Furthermore, the first and second passivation layers 131 and 132 may be formed of an organic insulating material such as an acrylic resin, an epoxy resin, a phenolic resin, a polyamide resin, or a polyimide resin.

The planarization layer 150 may be disposed on the second passivation layer 132. The planarization layer 150 may include a first planarization layer and a second planarization layer 151 and 152. The first planarization layer 151 may be disposed in the first light emitting part EM1, and the second planarization layer 152 may be disposed in the second light emitting part EM2. Also, the first and second planarization layers 151 and 152 may be spaced apart from each other by the opening OP.

Each of the first and second planarization layers 151 and 152 may include a lower layer 151*a* and 152*a* and an upper layer 151*b* and 152*b*. The lower layer 151*a* and 152*a* may be disposed on the second passivation layer 132, and the upper layer 151*b* and 152*b* may be disposed on the lower layers 151*a* and 152*a*.

Each of the first and second planarization layers 151 and 152 may have an undercut UC in a side surface of each of the first and second planarization layers 151 and 152 adjacent to the opening OP. Specifically, an area of an upper surface of the lower layer 151*a* and 152*a* may be smaller than an area of a lower surface of the upper layer 151*b* and 152*b*. Also, one side of the upper layer 151*b* and 152*b* protrudes on the lower layer 151*a* and 152*a*, and thus the lower surface of the upper layer 151*b* and 152*b* may be exposed to the outside. Also, a side surface of the lower layer 151*a* and 152*a* may have a reverse tapered shape, and a side surface of the upper layers 151*b* and 152*b* may have a tapered shape.

The first and second planarization layers 151 and 152 may be formed of an organic insulating material such as an acrylic resin, an epoxy resin, a phenolic resin, a polyamide resin, or a polyimide resin.

The first light emitting device 160 may be disposed on the first planarization layer 151. The first light emitting device 160 may include a first electrode 161, a light emitting layer 162, and a second electrode 163.

The first electrode 161 is disposed on the first planarization layer 151 and may function as an anode of the display device. The first electrode 161 may be electrically connected with the drain electrode 125 of the thin film transistor 120. As an example, the first electrode 161 may be electrically connected with the drain electrode 125 of the thin film transistor 120 through the first connection electrode 141 disposed on the first passivation layer 131. Embodiments are not limited thereto. As an example, the first connection electrode 141 may be omitted depending on the design. In this case, the first electrode 161 may be directly connected with the drain electrode 125 of the thin film transistor 120, without being limited thereto.

The first electrode 161 may include a transparent conductive material such as an indium tin oxide (ITO) or an indium zinc oxide (IZO). Alternatively, the first electrode 161 may include a metal material such as aluminum (Al), silver (Ag), copper (Cu), molybdenum (Mo), titanium (Ti), tungsten (W), or chromium (Cr), or an alloy thereof. Also, although illustrated as a single layer, the first electrode 161 may be formed of multiple layers.

The bank 180 may be disposed on the first planarization layer 151 and the first electrode 161. The bank 180 may define a light emitting area and a non-light emitting area of the first light emitting part EM1. That is, an area in which the bank 180 is not disposed may be the light emitting area, and an area in which the bank 180 is disposed may be a non-light emitting area.

The bank 180 may include an organic insulating material such as an acrylic resin, an epoxy resin, a phenolic resin, a polyamide resin, a polyimide resin, or the like. Alternatively, the bank 750 may include an inorganic insulating material such as silicon oxide (SiOx), silicon nitride (SiNx), silicon oxynitride (SiOxNy). Also, the bank 180 may include a black dye in order to absorb light incident from the outside.

The light emitting layer 162 may be disposed on the first electrode 161. The light emitting layer 162 may also be disposed on an upper surface of the bank 180. Also, the light emitting layer 162 may extend from the upper surface of the bank 180 and be disposed on a side surface of the bank 180 adjacent to the opening OP and a side surface of the upper layer 151*b* of the first planarization layer 151. In this case, since the first planarization layer 151 has the undercut UC, the light emitting layer 162 may not be disposed on a side surface of the lower layer 151*a*.

The light emitting layer 162 may include a hole transporting layer, an organic emission layer, and an electron transporting layer. In this case, when a voltage is applied to the first electrode 161 and the second electrode 163, holes and electrons move to the organic emission layer through the hole transport layer and the electron transport layer, respectively, and may be combined with each other in the organic emission layer to emit light. Embodiments are not limited thereto. As an example, at least one of the hole transporting layer and the electron transporting layer may be omitted depending one the design, and/or one or more additional layer may be further included.

The second electrode 163 may be disposed on the light emitting layer 162. The second electrode 163 may function as a cathode of the display device. Like the light emitting layer 162, the second electrode 163 may also be disposed on the upper surface of the bank 180. Also, the second electrode 163 may extend from the upper surface of the bank 180 and be disposed on the side surface of the bank 180 adjacent to the opening OP and the side surface of the upper layer 151*b* of the first planarization layer 151. In this case, since the first planarization layer 151 has the undercut UC, the second electrode 163 may not be disposed on the side surface of the lower layer 151*a*.

Since the display device according to an embodiment of the present invention is configured in the top emission type, the second electrode 163 may include a transparent conductive material such as an indium tin oxide (ITO) or an indium zinc oxide (IZO) to transmit the light emitted from the light emitting layer 162 toward an upper portion of the display device.

The second light emitting device 170 may be disposed on the second planarization layer 152. The second light emitting device 170 may include a first electrode 171, a light emitting layer 172, and a second electrode 173. Since the second light emitting device 170 has the same structure as the first light emitting device 160, a detailed description thereof will be omitted. Also, the first electrode 171 may be electrically connected with the drain electrode 125 of the thin film transistor 120 through the second connection electrode 142 disposed on the first passivation layer 131. The second connection electrode 142 may be spaced apart from the first connection electrode 141, without being limited thereto. As an example, the second connection electrode 142 may be connected to or may be integrated with the first connection electrode 141

Meanwhile, the first electrodes 161 and 171 of the first and second light emitting devices 160 and 170 may be electrically connected with the drain electrode 125 of the same thin film transistor 120. On the other hand, the light emitting layers 162 and 172 of the first and second light emitting devices 160 and 170 may be spaced apart from each other by the opening OP. Also, the second electrodes 163 and 173 of the first and second light emitting devices 160 and 170 may be spaced apart from each other by the opening OP. Accordingly, the first electrodes 161 and 171 of the first and second light emitting devices 160 and 170 may not be electrically connected with each other, or may be electrically connected with each other, for example, via the first and second connection electrodes 141, 142 and the drain electrode 125 of the thin film transistor 120, without being limited thereto.

A dummy layer D may be disposed on the second passivation layer 132 and disposed in the opening OP. Also, the dummy layer D may be spaced apart from the planarization layer 151 and may not overlap the undercut UC. The dummy layer D may include a first dummy layer D1 and a second dummy layer and D2. The first dummy layer D1 may be disposed on the second passivation layer 132, and the second dummy layer D2 may be disposed on the first dummy layer D1.

The first dummy layer D1 may include the same material as the light emitting layer 162 and 172. Specifically, in the process of forming the light emitting layer 162 and 172, a light emitting material may be deposited on the substrate 110. In this case, the light emitting material may not be deposited on the entire surface of the substrate 110 due to the undercut UC and the opening OP. Accordingly, the light emitting material deposited to be spaced apart from the light emitting layer 162 and 172 remains in the opening OP, and the light emitting material remaining in the opening OP may become the first dummy layer D1.

The second dummy layer D2 may include the same material as the second electrode 163 and 173. Specifically, in the process of forming the second electrode 163 and 173, a conductive material may be deposited on the substrate 110. In this case, the conductive material may not be deposited on the entire surface of the substrate 110 due to the undercut UC and the opening OP. Accordingly, the conductive material deposited to be spaced apart from the second electrode 163 and 173 remains in the opening OP, and the conductive material remaining in the opening OP may become the second dummy layer D2.

Figure 5:
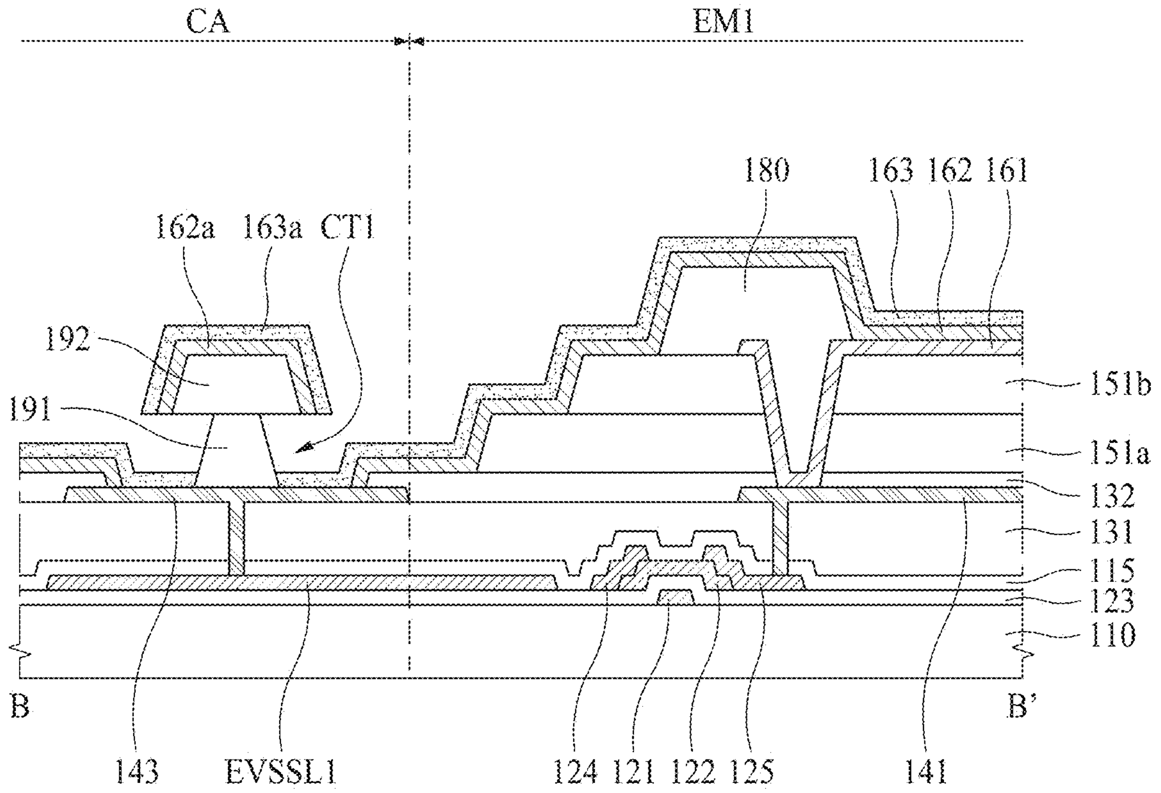
FIG. 5 is a cross-sectional view taken along line B-B' of FIG. 3 according to an embodiment of the present disclosure.

FIG. 5 is a cross-sectional view taken along line B-B' of FIG. 3 according to one embodiment. That is, FIG. 5 is a cross-sectional view of a contact area CA and the first light emitting part EM1.

Referring to FIG. 5, a portion of the first low-potential line EVSSL1 or a portion extending from one side of the first low-potential line EVSSL1 may be disposed in the contact area CA. As described above, the first low-potential line EVSSL1 may be disposed on the same layer as the source electrode 124 and the drain electrode 125.

A third connection electrode 143 is disposed on the first passivation layer 131. As an example, the third connection electrode 143 may be formed through the same process as the first and second connection electrodes 141 and 142, or may be formed through a separate process from the first and second connection electrodes 141 and 142, without being limited thereto. The third connection electrode 143 may be electrically connected with the first low-potential line EVSSL1 through a contact hole formed in the first passivation layer 131.

A first contact portion CT1 may be disposed in the second passivation layer 132. The first contact portion CT1 may expose a portion or the entirety of an upper surface of the third connection electrode 143.

A spacer 190 may be disposed on the third connection electrode 143. The spacer 190 may include a first spacer 191 and a second spacer and 192. The first spacer 191 may be disposed on the third connection electrode 143, and the second spacer 192 may be disposed on the first spacer 191.

The first spacer 191 is disposed in the first contact portion CT1 and may be in contact with a portion of the upper surface of the third connection electrode 143. That is, an area of a lower surface of the first spacer 191 may be smaller than an area of the upper surface of the third connection electrode 143 exposed by the second passivation layer 132. Also, an area of a lower surface of the second spacer 192 may be larger than an area of an upper surface of the first spacer 191. That is, an edge of the second spacer 192 may protrude from the first spacer 191, and a portion of the lower surface of the second spacer 192 may be exposed to the outside.

The light emitting layer 162 and the second electrode 163 disposed in the first light emitting part EM1 may extend to the contact area CA. The light emitting layer 162 may cover side surfaces of the first planarization layer 151 and the second passivation layer 132 adjacent to the contact area CA. Also, the light emitting layer 162 may be disposed in the first contact part CT1. Also, the light emitting layer 162 may cover only a partial area of the upper surface of the third connection electrode 143 exposed by the second passivation layer 132.

Likewise, the second electrode 163 may cover side surfaces of the first planarization layer 151 and the second passivation layer 132 adjacent to the contact area CA. Also, the second electrode 163 may be disposed in the first contact portion CT1. Also, the second electrode 163 may cover at least a portion of or the entirety of the third connection electrode 143 exposed by the light emitting layer 162. Accordingly, the second electrode 163 may be in contact with the third connection electrode 143 by the first contact portion CT1. That is, the second electrode 163 may be electrically connected with the first low-potential line EVSSL1 through the third connection electrode 143. Likewise, although not illustrated in FIG. 5, the second electrode 173 of the second light emitting device 170 may also be electrically connected with the second low-potential line EVSSL2 through a second contact portion CT2.

A light emitting material layer 162*a* and a conductive material layer 163*a* may be disposed on the spacer 190. The light emitting material layer 162*a* and the conductive material layer 163*a* may be disposed on an upper surface and a side surface of the second spacer 192.

The light emitting material layer 162*a* may include the same material as the light emitting layer 162. Specifically, in the process of forming the light emitting layer 162, a light emitting material may be deposited on the substrate 110. In this case, the light emitting material may not be deposited on the entire surface of the substrate 110 by the spacer 190. Accordingly, the light emitting material deposited to be spaced apart from the light emitting layer 162 remains on the spacer 190, and the light emitting material remaining on the spacer 190 may become the light emitting material layer 162*a*.

The conductive material layer 163*a* may include the same material as the second electrode 163. Specifically, in the process of forming the second electrode 163, a conductive material may be deposited on the substrate 110. In this case, the conductive material may not be deposited on the entire surface of the substrate 110 by the spacer 190. Accordingly, the conductive material deposited to be spaced apart from the second electrode 163 may remain on the spacer 190, and the conductive material remaining on the spacer 190 may become the conductive material layer 163*a*.

Figure 6:
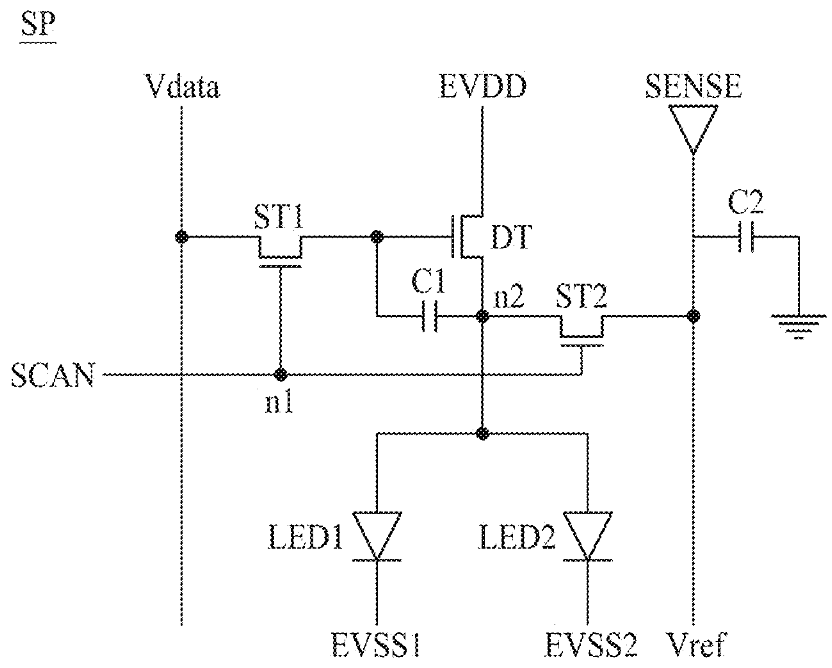
FIG. 6 is a circuit diagram of a sub-pixel according to an embodiment of the present disclosure.

FIG. 6 is a circuit diagram of a sub-pixel SP according to an embodiment of the present disclosure.

The sub-pixel SP may include a plurality of transistors ST1, ST2, and DT, a plurality of light emitting devices LED1 and LED2, and a plurality of capacitors C1 and C2. A plurality of transistors ST1, ST2, and DT may include first and second switching transistors ST1 and ST2 and a driving transistor DT. Embodiments are not limited thereto. As an example, at least one of the above-mentioned components may be omitted, or one or more additional components may be further included. As an example, one or more transistors, light emitting devices and capacitors may be further included.

Each of the plurality of transistors ST1, ST2, and DT of the sub-pixel SP includes a gate electrode, a source electrode, and a drain electrode. Since the source electrode and the drain electrode are not fixed and may be changed according to the voltage and current directions applied to the gate electrode, one of the source electrode and the drain electrode may be expressed as the first electrode, and the other may be expressed as the second electrode.

The first and second switching transistors ST1 and ST2 may operate according to a scan signal SCAN. When the scan signal SCAN is the gate-on voltage, the first switching transistor ST1 may supply a data voltage Vdata to a first electrode of the first capacitor C1. Also, when the scan signal SCAN is the gate-on voltage, the second switch transistor T2 may supply an initialization voltage Vref to a second electrode of the first capacitor C1. Although it is illustrated that the first and second switching transistors ST1 and ST2 may operate according to the same scan signal SCAN, embodiments are not limited thereto. As an example, the first and second switching transistors ST1 and ST2 may operate according to different scan signals, and may operate at the same or different timings.

A first electrode of the driving transistor DT may be supplied with a high potential voltage EVDD, and a second electrode of the driving transistor DT may be connected with the first and second light emitting devices LED1 and LED2. The driving transistor DT may control an intensity of light of the first and second light emitting devices LED1 and LED2 by controlling a driving current Ids according to a driving voltage Vgs of the first capacitor C1.

The first capacitor C1 may be connected between the gate electrode and the first electrode of the driving transistor DT to charge the driving voltage Vgs corresponding to the data voltage Vdata. During the light emission period, the first capacitor C1 may maintain the charged driving voltage Vgs and supply the driving voltage Vgs to the driving transistor DT.

The first light emitting device LED1 may include an anode connected with the driving transistor DT and a cathode supplied with the first low-potential voltage EVSS1. Also, the second light emitting device LED2 may include an anode connected with the driving transistor DT and a cathode supplied with the second low-potential voltage EVSS2. That is, the first and second light emitting devices LED1 and LED2 may be controlled by the same driving transistor DT. Also, the anodes of the first and second light emitting devices LED1 and LED2 are connected at a second node n2, but the cathodes of the first and second light emitting devices LED1 and LED2 may not be electrically connected with each other.

In this case, it is possible to check whether the first and second light emitting devices LED1 and LED2 operate normally through the first and second low-potential voltages EVSS1 and EVSS2.

In detail, the first and second low-potential voltages EVSS1 and EVSS2 may be set to have different voltage values. For example, the first low-potential voltage EVSS1 may be set to 10 V, and the second low-potential voltage EVSS2 may be set to 0 V. In this case, it is possible to check whether the first light emitting device LED1 connected with the first low-potential voltage EVSS1 operates normally.

In addition, the second node n2 to which the driving transistor DT and the first and second light emitting devices LED1 and LED2 are connected may be charged with an arbitrary voltage. That is, the source electrode of the driving transistor DT may be charged with the arbitrary voltage. And, after an arbitrary time has passed, an amount of change in a voltage of the second node n2 may be detected through a sensing unit SENSE to check whether the first light emitting device LED1 is normal or not.

Figure 7:
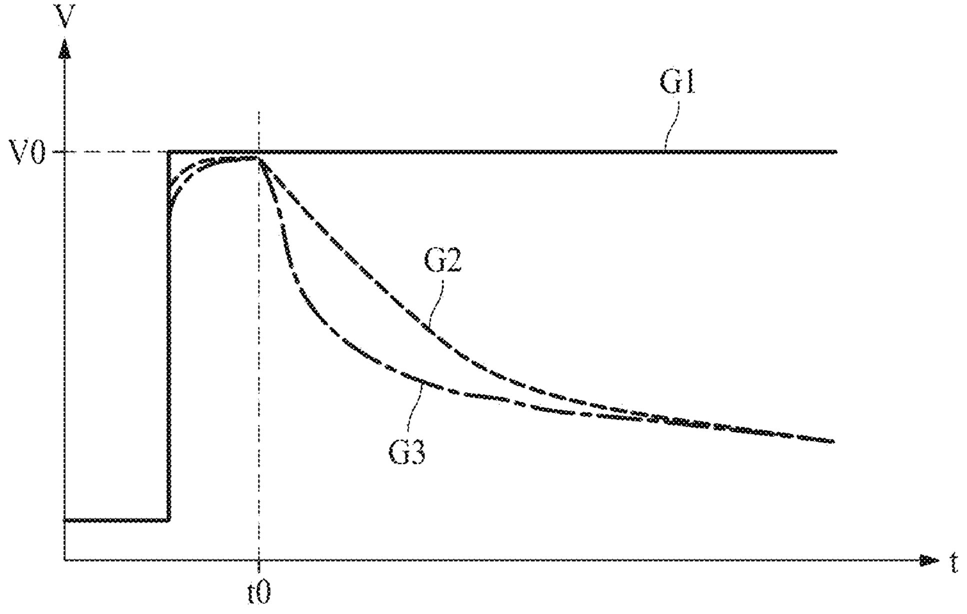
FIG. 7 is a graph illustrating a variation of a voltage according to an embodiment of the present disclosure.

FIG. 7 is a graph illustrating the amount of change in the voltage of the second node n2 according to one embodiment. FIG. 7 illustrates the amount of change in the voltage of the second node n2 after a test voltage V0 is applied to the source electrode of the driving transistor DT and then a test time t0 has passed.

A first graph G1 illustrates a case where the light emitting device is normally driven. When the light emitting device is normally driven, the test voltage V0 applied to the source electrode of the driving transistor DT may be stably maintained.

On the other hand, a second graph G2 and a third graph and G3 illustrate a case where the light emitting device is not normally driven. When the light emitting device is not normally driven, the voltage applied to the source electrode of the driving transistor DT may be discharged. In this case, the smaller a resistance of the light emitting device, the faster a voltage may be discharged. That is, the resistance of the light emitting device may be relatively smaller in the third graph G3 than in the second graph G2.

Accordingly, by forming the first and second low-potential voltage lines EVSSL1 and EVSSL2 rather than one low-potential voltage line, it is possible to check whether the sub-pixel is normal by applying the first and second low-potential voltage EVSS1 and EVSS2 to each of the first and second light emitting devices LED1 and LED2.

Figure 8:
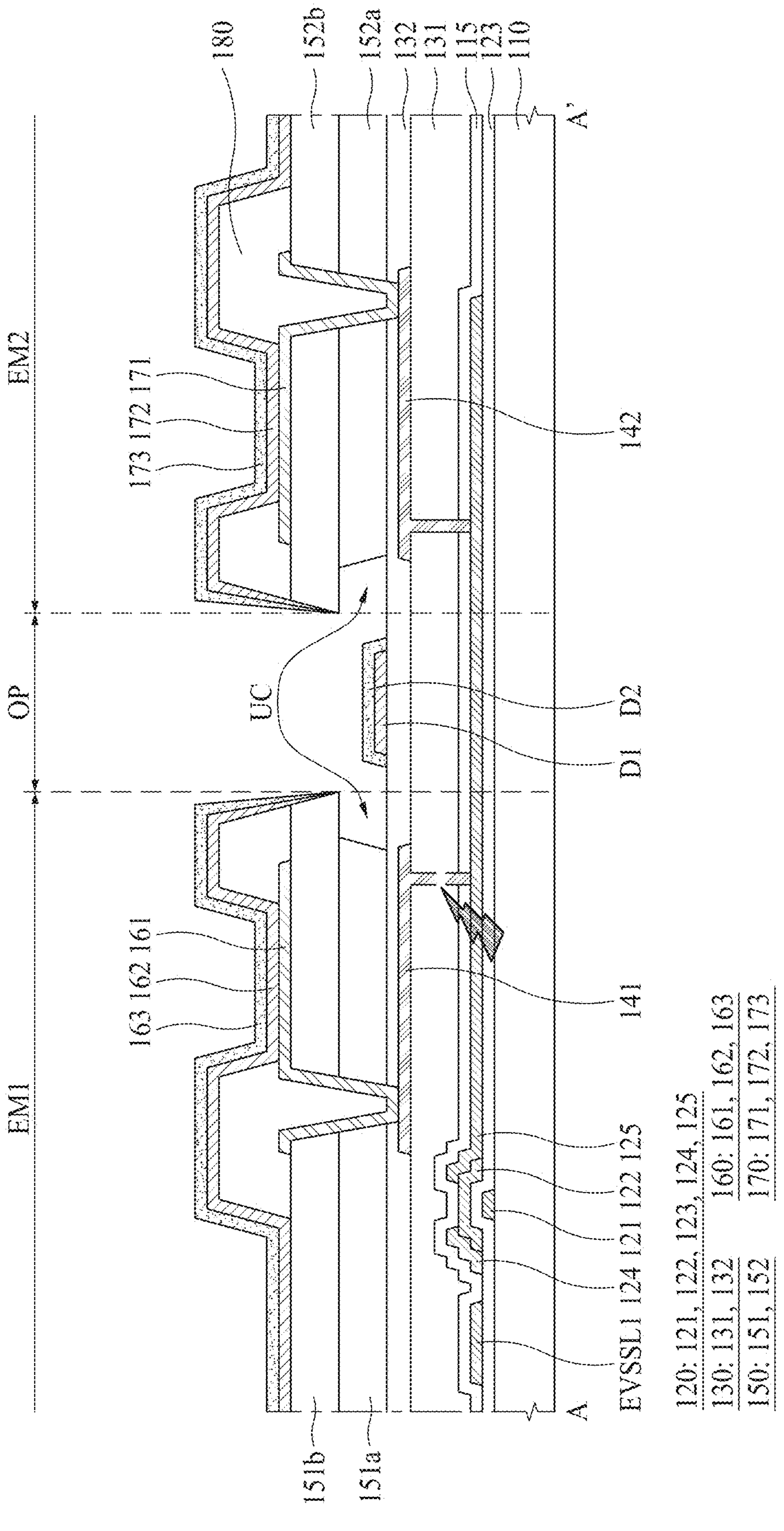
FIG. 8 is a cross-sectional view illustrating a repair process according to an embodiment of the present disclosure.

As described above, after checking whether the sub-pixel is normal, a repair process may be performed. Specifically, FIG. 8 illustrates the repair process when the first light emitting device 160 is not normally driven. Referring to FIG. 8, the first connection electrode 141 may be disconnected through a laser process. Accordingly, the first electrode 161 of the first light emitting device 160 may not be electrically connected with the drain electrode 125 of the thin film transistor 120. Accordingly, the first light emitting device 160 cannot emit light.

On the other hand, the second light emitting device 170 may be electrically connected with the drain electrode 125 of the thin film transistor 120 through the second connection electrode 142. Accordingly, the second light emitting device 170 may emit light. That is, even when the first light emitting device 160 does not emit light, the sub-pixel may emit light through the second light emitting device 170. Accordingly, the sub-pixel may be normally driven.

Figure 9:
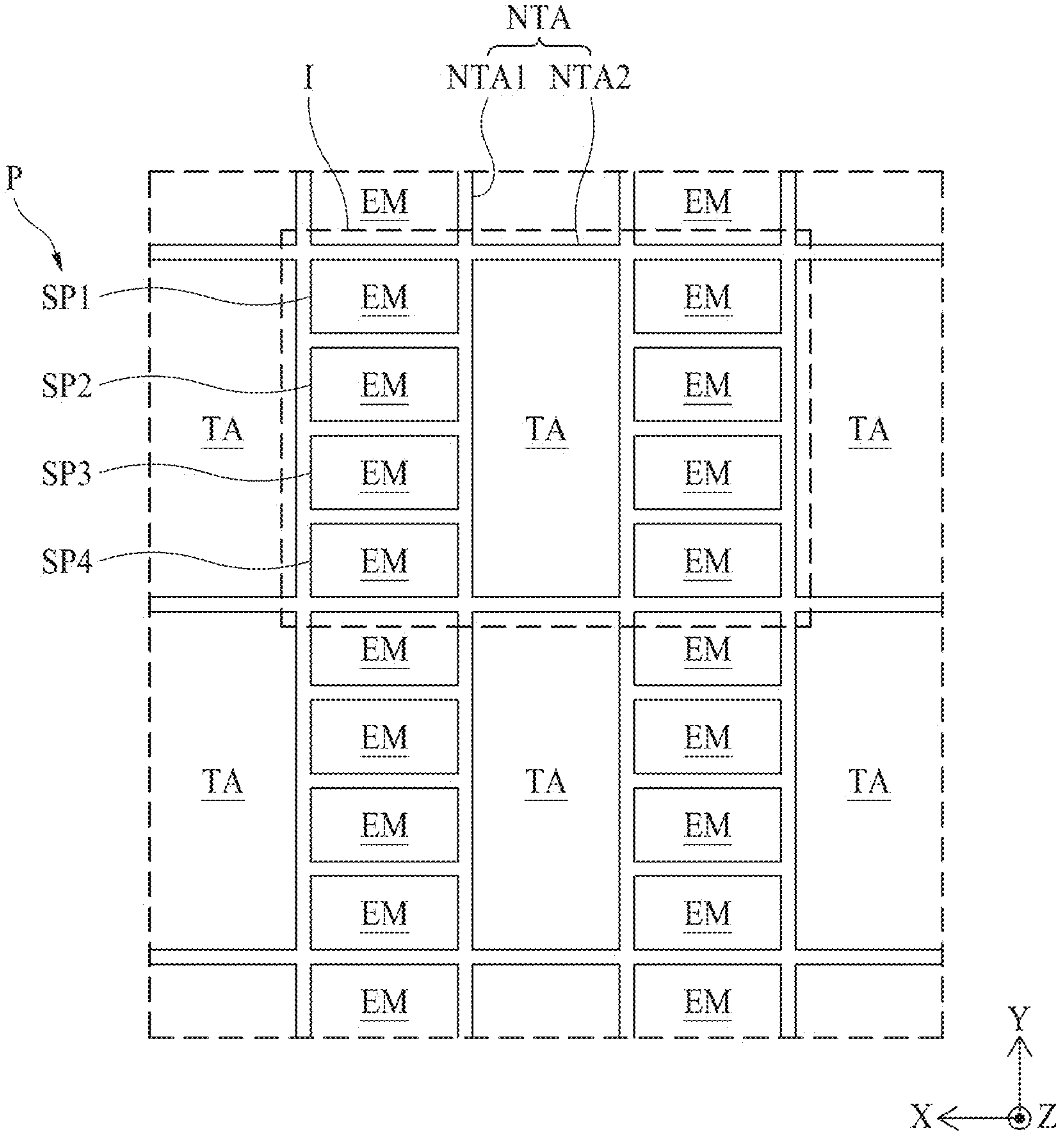
FIG. 9 is a diagram illustrating a region of a display device according to an embodiment of the present disclosure.

FIG. 9 is a diagram illustrating a region of a display device according to an embodiment of the present disclosure.

Referring to FIG. 9, the display device may include a transmissive area TA and a non-transmissive area NTA. The transmission area TA may be an area that passes most of a light incident from the outside, and the non-transmissive area NTA may be an area that does not pass most of the light incident from the outside. For example, the transmissive area TA may be an area having a light transmittance greater than a %, and the non-transmissive area NTA may be an area having a light transmittance less than b %. In this case, a may be a value greater than b. The display device according to an embodiment of the present invention may view an object or a background positioned on the rear surface (or bottom surface) of the display panel 100 through the transmissive area TA.

The non-transmissive area NTA may include a plurality of pixels P, a first non-transmissive area NTA1, and a second non-transmissive area NTA2.

Each pixel P is disposed in each area where the first non-transmissive area NTA1 and the second non-transmissive area NTA2 intersect, and may emit light to display an image. Each of the pixels P may include a plurality of sub-pixels SP1, SP2, SP3, and SP4.

The transmissive area TA may be adjacent to the pixel P in a first direction X. That is, the transmissive area TA may be adjacent to the plurality of sub-pixels SP1, SP2, SP3, and SP4 in the first direction X. Also, the plurality of sub-pixels SP1, SP2, SP3, and SP4 in each pixel P may be adjacent to each other in a second direction Y.

Each pixel P may include a light emitting area EM that emits light corresponding to the plurality of sub-pixels SP1, SP2, SP3, and SP4 including a light emitting device. The light emitting area EM may be an area that emits light from the pixel P. Also, the light emitting area EM may overlap a pixel circuit of the plurality of sub-pixels SP1, SP2, SP3, and SP4.

The light emitting areas EM corresponding to the plurality of sub-pixels SP1, SP2, SP3, and SP4 may all emit light of different colors, or the light emitting areas EM corresponding to two or more of the plurality of sub-pixels SP1, SP2, SP3, and SP4 may emit light of the same color, without being limited thereto. For example, the light emitting area EM of the first sub-pixel SP1 may emit green light, the light emitting area EM of the second sub-pixel SP2 may emit blue light, the light emitting area EM of the third sub-pixel SP3 may emit white light, and the light emitting area EM of the fourth sub-pixel SP4 may emit red light, but is not limited thereto.

The plurality of sub-pixels SP1, SP2, SP3, and SP4 may be configured in a stripe type arranged in the second direction Y or a quad type arranged in the first and second directions X and Y, but are not limited thereto.

The first non-transmissive area NTA1 may extend in the display panel 100 in the second direction Y, and may be disposed to at least partially overlap the light emitting area EM of each of the sub-pixels SP1, SP2, SP3, and SP4. A plurality of first non-transmissive areas NTA1 may be configured. The plurality of first non-transmissive areas NTA1 may be disposed to be spaced apart from each other in the first direction X, and may extend in the second direction Y. Two adjacent first non-transmissive areas NTA1 may be disposed to be spaced apart from each other with the transmissive area TA interposed therebetween. For example, the transmissive area TA may be between two adjacent first non-transmissive areas NTA1.

At least one first signal line extending in the second direction Y may be disposed in the first non-transmissive area NTA1. In addition, at least one first signal line may overlap the first non-transmissive area NTA1. The at least one first signal line may include at least one of a high-potential power line, a low-potential power line, and a data line, but is not limited thereto.

The second non-transmissive area NTA2 may extend in the display panel 100 in the first direction X, and may be disposed to at least partially overlap the light emitting area EM of each of the sub-pixels SP1, SP2, SP3, and SP4, or may be disposed to not overlap the light emitting area EM of each of the sub-pixels SP1, SP2, SP3, and SP4, without being limited thereto. A plurality of second non-transmissive areas NTA2 may be configured. The plurality of second non-transmissive areas NTA2 may extend in the first direction X and may be disposed to be spaced apart from each other in the second direction Y. Two adjacent second non-transmissive areas NTA2 may be disposed to be spaced apart from each other with the transmissive area TA interposed therebetween. For example, the transmissive area TA may be between two adjacent second non-transmissive areas NTA2.

At least one second signal line extending in the first direction X may be disposed in the second non-transmissive area NTA2. Also, at least one second signal line may include a scan line SL (or a gate line), but is not limited thereto.

Figure 10:
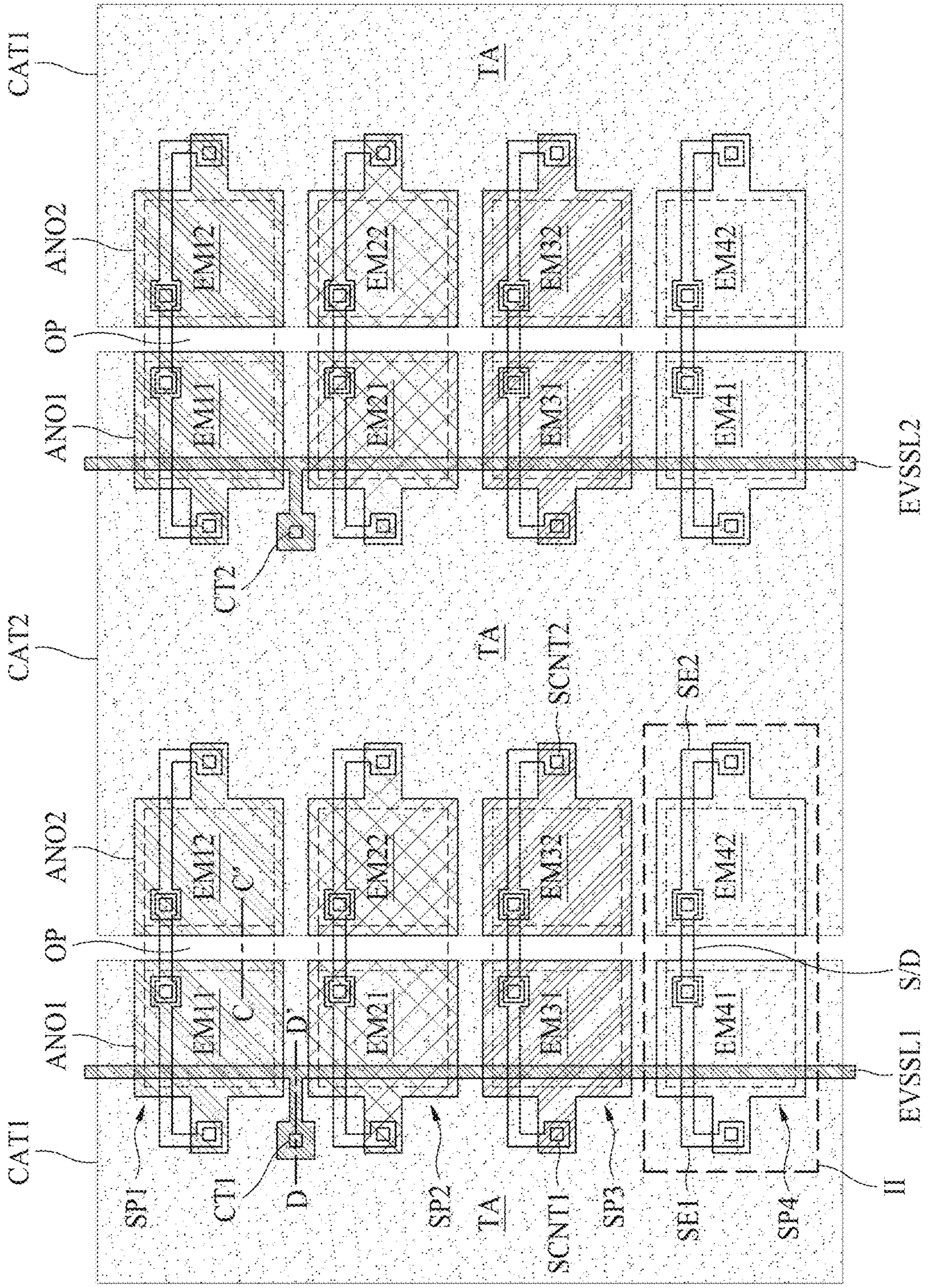
FIG. 10 is a view illustrating an area I shown in FIG. 9 according to an embodiment of the present disclosure.

FIG. 10 is a view illustrating an area I shown in FIG. 9 according to an embodiment of the present disclosure.

Referring to FIG. 10, the display device according to an embodiment of the present invention may include a plurality of sub-pixels SP1, SP2, SP3, and SP4, a first low-potential voltage line EVSSL1, and a second low-potential voltage line EVSSL2.

As an example, the first and second low-potential voltage lines EVSSL1 and EVSSL2 are disposed below the plurality of sub-pixels SP1, SP2, SP3, and SP4, and the plurality of sub-pixels SP may overlap the first and second low-potential voltage lines EVSSL1 and EVSSL2. In addition, each of the first and second low-potential voltage lines EVSSL1 and EVSSL2 may be extend in the second direction Y. That is, one low-potential voltage line EVSSL may overlap the plurality of sub-pixels SP1, SP2, SP3, and SP4 that emit light of different colors. Also, FIG. 10 shows that the first and second low-potential voltage lines EVSSL1 and EVSSL2 are adjacent to a left end of the sub-pixel SP, but are not limited thereto. For example, the first and second low-potential voltage lines EVSSL1 and EVSSL2 may be adjacent to a right end of the sub-pixel SP, or the center portion of the sub-pixel SP, without being limited thereto. As an example, the first and second low-potential voltage lines EVSSL1 and EVSSL2 may not overlap the sub-pixel SP. As an example, the first and second low-potential voltage lines EVSSL1 and EVSSL2 may overlap the transmissive area TA. As an example, the first and second low-potential voltage lines EVSSL1 and EVSSL2 may comprise a transparent conductive material or an opaque conductive material, without being limited thereto.

Each of the plurality of sub-pixels SP1, SP2, SP3, and SP4 may include a first light emitting part EM11, EM21, EM31, or EM41, a second light emitting part EM12, EM22, EM32, or EM42 or an opening OP. Each of the first light emitting parts EM11, EM21, EM31, or EM41 or the second light emitting parts EM12, EM22, EM32, or EM42 includes a light emitting device and may emit light. In addition, the first light emitting parts EM11, EM21, EM31, or EM41 and the second light emitting parts EM12, EM22, EM32, or EM42 of one sub-pixel SP may emit light of the same color. In one sub-pixel SP, the opening OP is disposed between the first light emitting parts EM11, EM21, EM31, or EM41 and the second light emitting parts EM12, EM22, EM32, or EM42 to separate the first light emitting parts EM11, EM21, EM31, or EM41, and the second light emitting parts EM12, EM22, EM32, or EM42. Also, the opening OP may not include a light emitting device.

One sub-pixel SP may receive the first and second low-potential voltages EVSS1 and EVSS2 from the first and second low-potential voltage lines EVSSL1 and EVSSL2. In addition, one sub-pixel SP may overlap any one of the first and second low-potential voltage lines EVSSL1 and EVSSL2 and may be spaced apart from the other one.

For example, the first sub-pixel SP1 may overlap the first low-potential voltage line EVSSL1 and may be spaced apart from the second low-potential power line EVSSL2. In addition, the second sub-pixel SP2 may overlap the second low-potential voltage line EVSSL2 and may be spaced apart from the first low-potential voltage line EVSSL1. In addition, the third sub-pixel SP3 may overlap the first low-potential voltage line EVSSL1 and may be spaced apart from the second low-potential voltage line EVSSL2. That is, the sub-pixel SP overlapping the first low-potential voltage line EVSSL1 and the sub-pixel SP overlapping the second low-potential voltage line EVSSL2 may be alternately disposed.

The first light emitting part EM11 of the first sub-pixel SP1 overlaps the first low-potential voltage line EVSSL1, and the second light emitting part EM12 of the first sub-pixel SP1 may be spaced apart from the first and second low-potential voltage lines EVSSL1 and EVSSL2. Also, the first light emitting part EM21 of the second sub-pixel SP2 overlaps the second low-potential voltage line EVSSL2, and the second light emitting part EM22 of the second sub-pixel SP2 may be spaced apart from the first and second low-potential voltage lines EVSSL1 and EVSSL2.

Each of the plurality of sub-pixels SP1, SP2, SP3, and SP4 may include a first anode ANO1 and a second anode ANO2. In each of the plurality of sub-pixels SP1, SP2, SP3, and SP4, the first anode ANO1 may be disposed in the first light emitting parts EM11, EM21, EM31, and EM41, and the second anode ANO2 may be disposed in the second light emitting parts EM12, EM22, EM32, and EM42. The first anode ANO1 and the second anode ANO2 may be spaced apart from each other with the opening OP interposed therebetween.

Each of the plurality of sub-pixels SP1, SP2, SP3, and SP4 may include a sub-electrode SE. The sub-electrode SE may include a first sub-electrode SE1 and a second sub-electrode SE2.

The first sub-electrode SE1 may electrically connect the first anode ANO1 to the source/drain electrode S/D of the driving transistor. Specifically, one side of the first sub-electrode SE1 may be electrically connected to the first anode ANO1 through a first sub-contact hole SCNT1, and the other side of the first sub-electrode SE1 may be electrically connected to the source/drain electrode S/D of the driving transistor.

The second sub-electrode SE2 may electrically connect the second anode ANO2 to the source/drain electrode S/D of the driving transistor. Specifically, one side of the second sub-electrode SE2 may be electrically connected to the second anode ANO2 through a second sub-contact hole SCNT2, and the other side of the second sub-electrode SE2 may be electrically connected to the source/drain electrode S/D of the driving transistor.

When a particle is formed in any one of the first anode ANO1 and the second anode ANO2, the sub-electrode SE may separate or disconnect an electrical connection between the anode where the particle is formed and the source/drain electrode S/D of the driving transistor.

Specifically, any one of the first anode ANO1 and the second anode ANO2 in which the particle is formed may be electrically separated from or disconnected from the sub-electrode SE, and the other anode of the first anode ANO1 and the second anode ANO2 in which the particle is not formed may be electrically connected to the source/drain electrode S/D of the driving transistor through the sub-electrode SE.

Accordingly, one of the first anode ANO1 and the second anode ANO2 in which the particle is formed may be darkened, and the other anode may be normally driven. Accordingly, the sub-pixel in which the particle is formed may be repaired through the sub-electrode SE.

The cathode CAT may include a first cathode CAT1 and a second cathode CAT2. The first cathode CAT1 may be disposed on the first low-potential voltage line EVSSL1. Also, the second cathode CAT2 may be disposed on the second low-potential voltage line EVSSL2. The first and second cathodes CAT1 and CAT2 may be spaced apart from each other in an area overlapping the opening OP.

The first low-potential voltage line EVSSL1 may include a first contact part CT1 formed to extend to one side of the first low-potential voltage line EVSSL1. The first low-potential voltage line EVSSL1 may be electrically connected to the first cathode CAT1 through the first contact part CT1. Also, the second low-potential voltage line EVSSL2 may include a second contact part CT2 formed to extend to one side of the second low-potential voltage line EVSSL2. The second low-potential voltage line EVSSL2 may be electrically connected to the second cathode CAT2 through the second contact part CT2.

As an example, one sub-pixel SP may include both the first cathode CAT1 receiving the first low-potential voltage EVSS1 from the first low-potential voltage line EVSSL1 and the second cathode CAT2 receiving the second low-potential voltage EVSS2 from the second low-potential voltage line EVSSL2. As an example, the first and second light emitting parts EM1 and EM2 of one subpixel may receive the low-potential voltage from different lines.

Accordingly, the display panel 100 according to an embodiment of the present invention may automatically detect a repair target for a repair process by checking whether the light emitting part emits light. Specifically, it is possible to check whether the light-emitting part driven by any one of the first low-potential voltage line EVSSL1 and the second low-potential voltage line EVSSL2 emits light. For example, if the light emitting part driven by the first low-potential voltage line EVSSL1 normally emits light and the light emitting part driven by the second low-potential voltage line EVSSL2 does not emit light, it can be determined that the light emitting part connected to the second low-potential voltage line EVSSL2 has a defect.

The first and second cathodes CAT1 and CAT2 may include a transparent conductive material such as indium tin oxide (ITO) or indium zinc oxide (IZO). Also, the first and second cathodes CAT1 and CAT2 may include the same material, but are not limited thereto.

Figure 11:
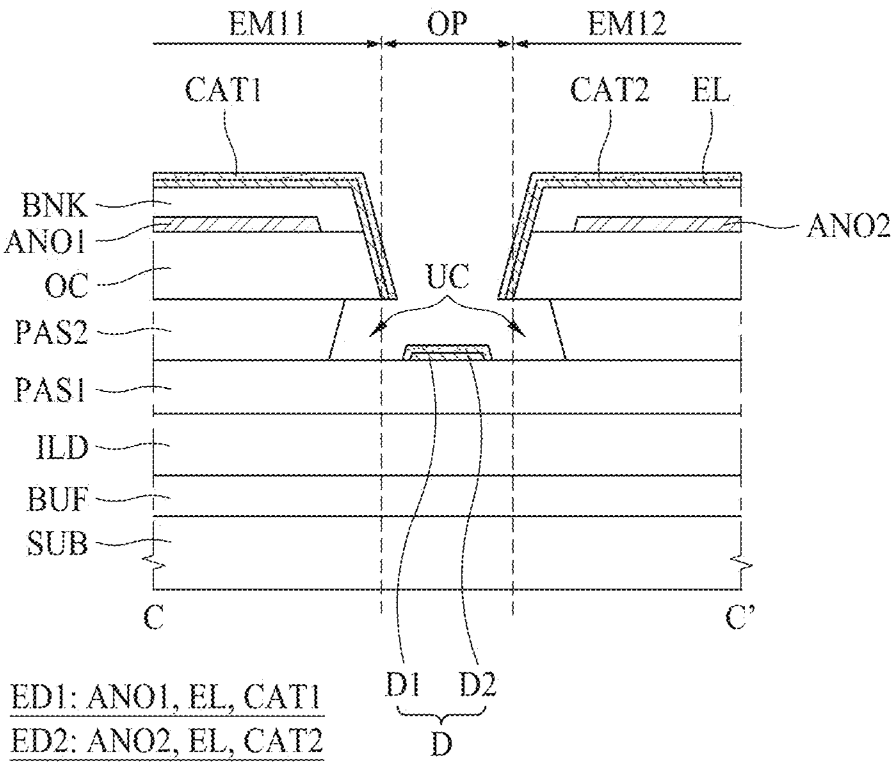
FIG. 11 is a cross-sectional view taken along line C-C' of FIG. 10 according to an embodiment of the present disclosure.

FIG. 11 is a cross-sectional view taken along line C-C' of FIG. 10 according to one embodiment. Specifically, FIG. 11 illustrates a cross-sectional view of the first sub-pixel SP1.

Referring to FIG. 11, the first sub-pixel SP1 may include a substrate SUB, a buffer layer BUF, an interlayer insulating layer ILD, a first passivation layer PAS1, a second passivation layer PAS2, a planarization layer OC, a bank BNK, a first light emitting device ED1, and a second light emitting device ED2.

The buffer layer BUF, the interlayer insulating layer ILD, the first passivation layer PAS1, the second passivation layer PAS2, and the planarization layer OC may be sequentially disposed on the substrate SUB. Each of the buffer layer BUF, the interlayer insulating layer ILD, the first passivation layer PAS1, the second passivation layer PAS2, and the planarization layer OC may be formed of an inorganic insulating material or an organic insulating material.

In this case, an undercut UC may be formed by the second passivation layer PAS2 and the planarization layer OC. In detail, an area of an upper surface of the second passivation layer PAS2 may be smaller than an area of a lower surface of the planarization layer OC. Also, one side of the planarization layer OC protrudes on the second passivation layer PAS2 so that the lower surface of the planarization layer OC may be exposed to the outside. Also, a side surface of the second passivation layer PAS2 may have a reverse taper shape, and a side surface of the planarization layer OC may have a taper shape.

The first light emitting device ED1 and the second light emitting device ED2 may be disposed on the planarization layer OC. The first light emitting device ED1 may include a first anode ANO1, a light emitting layer EL, and a first cathode CAT1. Also, the second light emitting device ED2 may include a second anode ANO2, a light emitting layer EL, and a second cathode CAT2.

The light emitting layer EL may extend from an upper surface of the bank BNK and may also be formed on a side surface of the bank BNK and a side surface of the planarization layer OC adjacent to the opening OP. Also, the light emitting layer EL may not be formed on a side surface of the second passivation layer PAS2 due to the undercut UC.

Like the light emitting layer EL, the first cathode CAT1 and the second cathode CAT2 may extend from the upper surface of the bank BNK, and may also be formed on the side surface of the bank BNK and the side surface of the planarization layer OC adjacent to the opening OP. Also, the first cathode CAT1 and the second cathode CAT2 may not be formed on the side surface of the second passivation layer PAS2 due to the undercut UC.

The dummy layer D may be disposed on the first passivation layer PAS1, and may be disposed in the opening OP. Also, the dummy layer D may be spaced apart from the second passivation layer PAS2, and may not overlap the undercut UC. The dummy layer D may include first and second dummy layers D1 and D2. The first dummy layer D1 may be disposed on the first passivation layer PAS1, and the second dummy layer D2 may be disposed on the first dummy layer D1.

The first dummy layer D1 may include the same material as the light emitting layer EL. Specifically, in the process of forming the light emitting layer EL, a light emitting material may be deposited on the substrate SUB. In this case, the light emitting material may not be deposited on the entire surface of the substrate SUB due to the undercut UC and the opening OP. Accordingly, the light emitting material deposited to be spaced apart from the light emitting layer EL remains in the opening OP, and the light emitting material remaining in the opening OP may become the first dummy layer D1.

The second dummy layer D2 may include the same material as the first cathode CAT1 and the second cathode CAT2. Specifically, in the process of forming the first cathode CAT1 and the second cathode CAT2, a conductive material may be deposited on the substrate SUB. In this case, the conductive material may not be deposited on the entire surface of the substrate SUB due to the undercut UC and the opening OP. Accordingly, the conductive material deposited to be spaced apart from the first cathode CAT1 and the second cathode CAT2 remains in the opening OP, and the conductive material remaining in the opening OP may become the second dummy layer D2.

Figure 12:
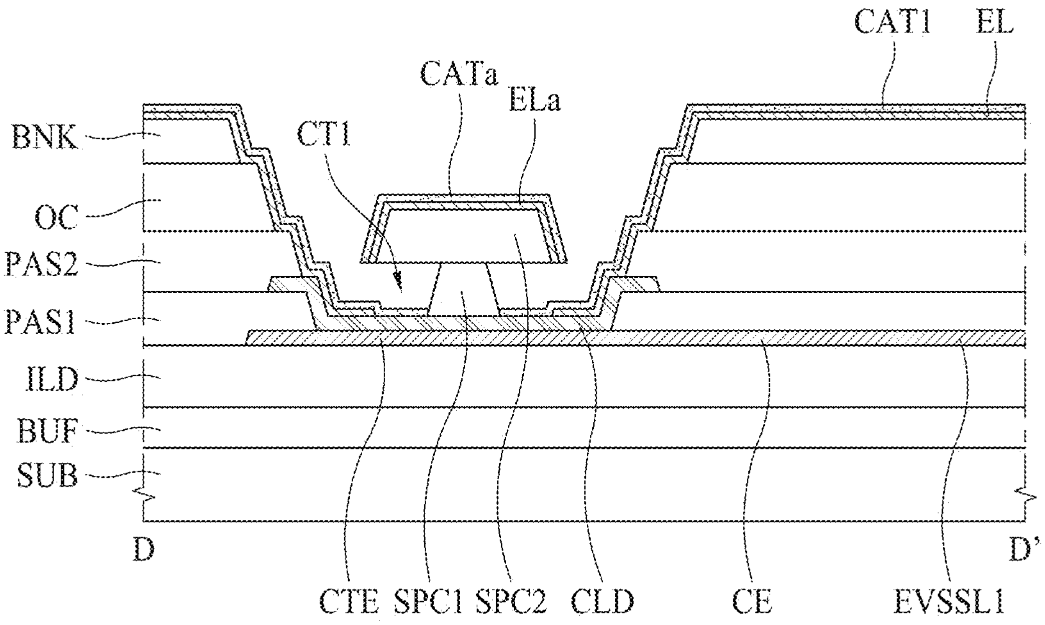
FIGS. 12 and 13 are cross-sectional views taken along the line D-D' of FIG. 10 according to different embodiment of the present disclosure.
Figure 13:
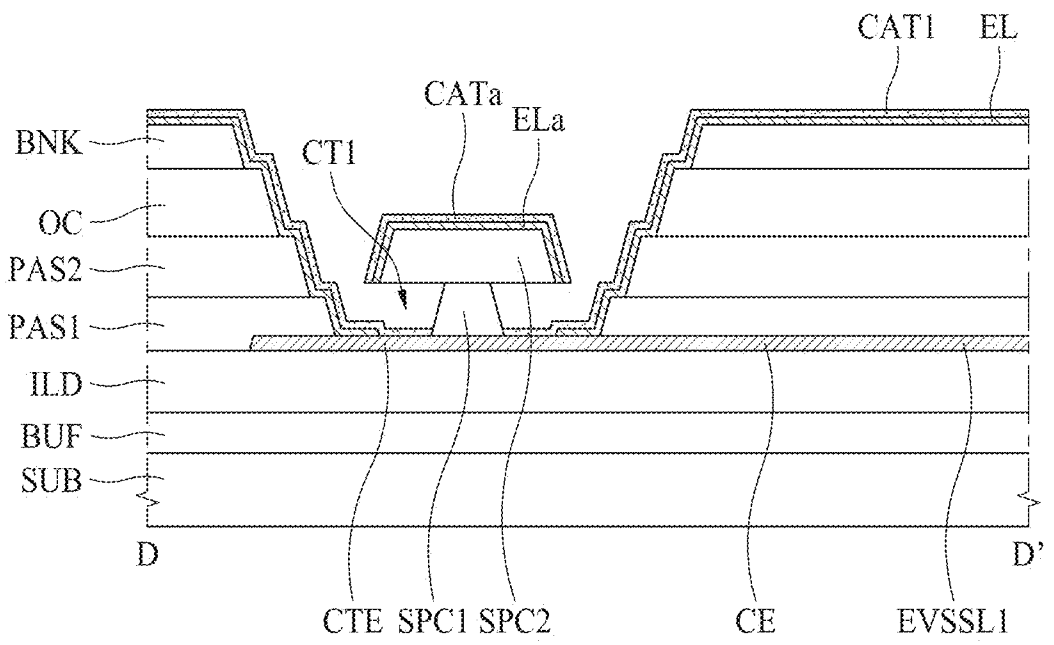

FIGS. 12 and 13 are cross-sectional views taken along the line D-D' of FIG. 10 according to different embodiments. Specifically, FIGS. 12 and 13 illustrate a cross-sectional view of the first contact portion CT1.

Referring to FIGS. 12 and 13, a contact electrode CTE may be disposed on the interlayer insulating layer ILD. The contact electrode CTE may be electrically connected to the first low-potential voltage line EVSSL1 through a connection electrode CE. FIG. 12 shows that the contact electrode CTE, the connection electrode CE, and the first low-potential voltage line EVSSL1 are formed on the same layer, but are not limited thereto.

A first contact part CT1 may be disposed on the first passivation layer PAS1. The first contact part CT1 may expose a part of an upper surface of the contact electrode CTE.

Referring to FIG. 12, a clad CLD may be disposed on the contact electrode CTE exposed by the first contact part CT1. The clad CLD reduces or prevents or at least reduces damage to the contact electrode CTE and may stably connect the contact electrode CTE to the first cathode CAT1. As an example, the clad CLD may cover the entirety of the upper surface of the contact electrode CTE exposed by the first contact part CT1. As an example, the clad CLD may extend to an upper surface of the first passivation layer PAS1 and may be disposed between the first passivation layer PAS1 and the second passivation layer PAS2, without being limited thereto. As an example, the clad CLD may comprise a conductive material. Alternatively, as shown in FIG. 13, the structure of the clad CLD may be omitted.

A spacer SPC may be disposed on the clad CLD. Alternatively, as shown in FIG. 13, when the structure of the clad CLD is omitted, the spacer SPC may be disposed on the contact electrode CTE.

The spacer SPC may include a first spacer SPC1 and a second spacer SPC2. The first spacer SPC1 is formed inside the first contact part CT1 and may be in contact with a portion of an upper surface of the clad CLD or a portion of the contact electrode CTE. An area of a lower surface of the first spacer SPC1 may be smaller than an area of the upper surface of the clad CLD exposed by the second passivation layer PAS2 or an area of the upper surface of the contact electrode CTE exposed by the first contact part CT1. Also, an area of a lower surface of the second spacer SPC2 may be larger than a area of an upper surface of the first spacer SPC1. For example, an edge of the second spacer SPC2 may protrude from the first spacer SPC1, and a part of the lower surface of the second spacer SPC2 may be exposed to the outside.

The light emitting layer EL and the first cathode CAT formed in the first light emitting part EM1 may extend to the first contact part CT1. The light emitting layer EL covers only a partial area of the clad CLD, and the first cathode CAT may cover the clad CLD exposed by the light emitting layer EL. Alternatively, the light emitting layer EL covers only a partial area of the upper surface of the contact electrode CTE exposed by the first contact part CT1, and the first cathode CAT may cover the upper surface of the contact electrode CTE exposed by the light emitting layer EL.

Accordingly, the first cathode CAT1 may be in contact with the clad CLD by the first contact part CT1. Alternatively, as shown in FIG. 13, when the structure of the clad CLD is omitted, the first cathode CAT1 may be in contact with the contact electrode CTE. Accordingly, the first cathode CAT1 may be electrically connected to the first low-potential voltage line EVSSL1 through the contact electrode CTE and the connection electrode CE.

A light emitting material layer ELa and a conductive material layer CATa may be disposed on the spacer SPC. The light emitting material layer ELa and the conductive material layer CATa may be disposed on the upper and side surfaces of the second spacer SPC2.

The light emitting material layer ELa may include the same material as the light emitting layer EL. Specifically, in the process of forming the light emitting layer EL, a light emitting material may be deposited on the substrate SUB. In this case, the light emitting material may not be deposited on the entire surface of the substrate SUB due to the spacer SPC. Accordingly, the light emitting material deposited to be spaced apart from the light emitting layer EL remains on the spacer SPC, and the light emitting material remaining on the spacer SPC may become the light emitting material layer ELa.

The conductive material layer CATa may include the same material as the first cathode CAT1. Specifically, in the process of forming the first cathode CAT1, a conductive material may be deposited on the substrate SUB. In this case, the conductive material may not be deposited on the entire surface of the substrate SUB due to the spacer SPC. Accordingly, the conductive material deposited to be spaced apart from the first cathode CAT1 remains on the spacer SPC, and the conductive material remaining on the spacer SPC may become the conductive material layer CATa.

Figure 14:
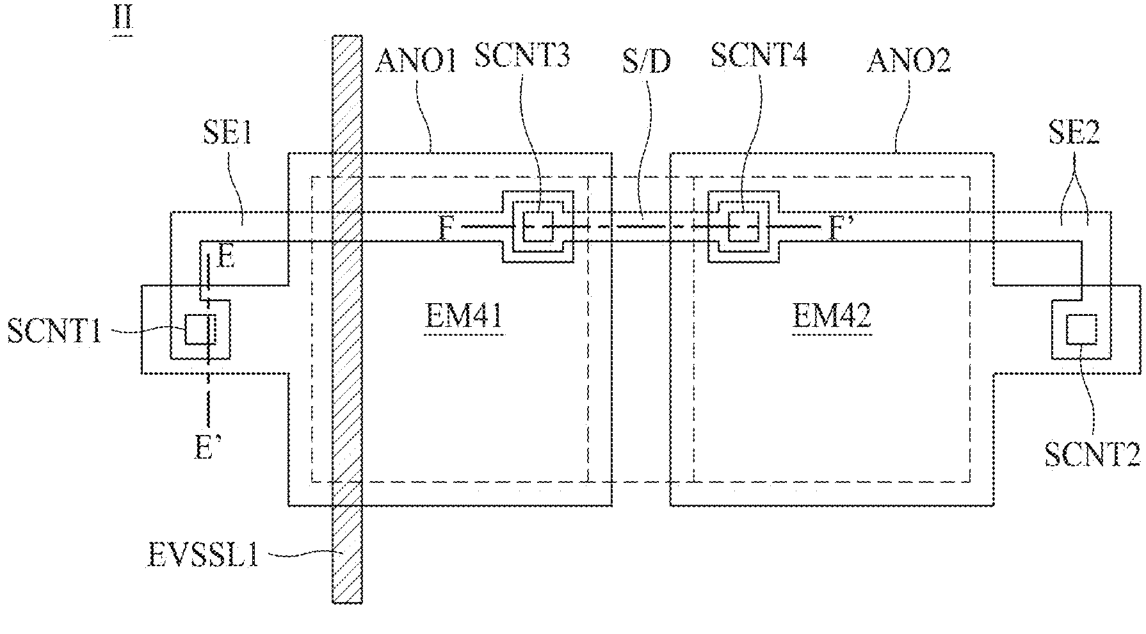
FIG. 14 is a view illustrating a region II shown in FIG. 10 according to an embodiment of the present disclosure.

FIG. 14 is a view illustrating a region II shown in FIG. 10 according to an embodiment of the present disclosure. Specifically, FIG. 14 illustrates a plan view of one sub-pixel SP, and configurations of the first and second cathodes CAT1 and CAT2 are omitted. Also, FIG. 15 is a cross-sectional view taken along line E-E' of FIG. 14 according to one embodiment and FIG. 16 is a cross-sectional view taken along line F-F' of FIG. 14 according to one embodiment.

As described above in FIG. 10, the first sub-electrode SE1 may electrically connect the first anode ANO1 to the source/drain electrode S/D of the driving transistor.

Figure 15:
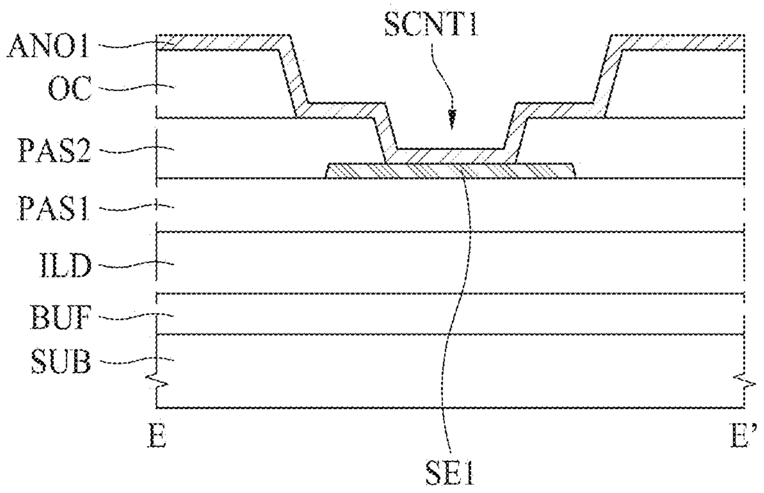
FIG. 15 is a cross-sectional view taken along line E-E' of FIG. 14 according to an embodiment of the present disclosure.

Referring to FIG. 15, the first sub-electrode SE1 may be disposed on the first passivation layer PAS1. The first sub-electrode SE1 may be electrically connected to the first anode ANO1 through the first sub-contact hole SCNT1 formed in the second passivation layer PAS2 and the planarization layer OC.

Figure 16:
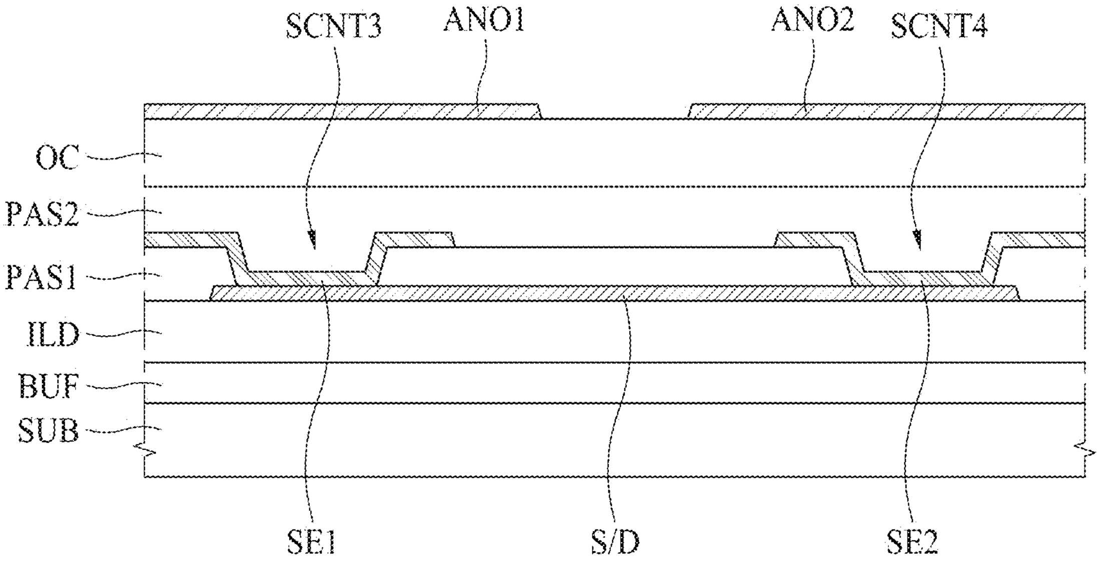
FIG. 16 is a cross-sectional view taken along line F-F' of FIG. 14 according to an embodiment of the present disclosure.

Referring to FIG. 16, the source/drain electrode S/D may be disposed on the interlayer insulating layer ILD. The first sub-electrode SE1 may be electrically connected to the source/drain electrode S/D through the third sub-contact hole SCNT3 formed in the first passivation layer PAS1. Also, the second sub-electrode SE2 may be electrically connected to the source/drain electrode S/D through the fourth sub-contact hole SCNT4 formed in the first passivation layer PAS1. Also, the fourth sub-contact hole SCNT4 is spaced apart from the third sub-contact hole SCNT3.

In conclusion, the source/drain electrode S/D of the driving transistor may be electrically connected to the first anode ANO1 and the second anode ANO2 through the sub-electrode SE.

Figure 17:
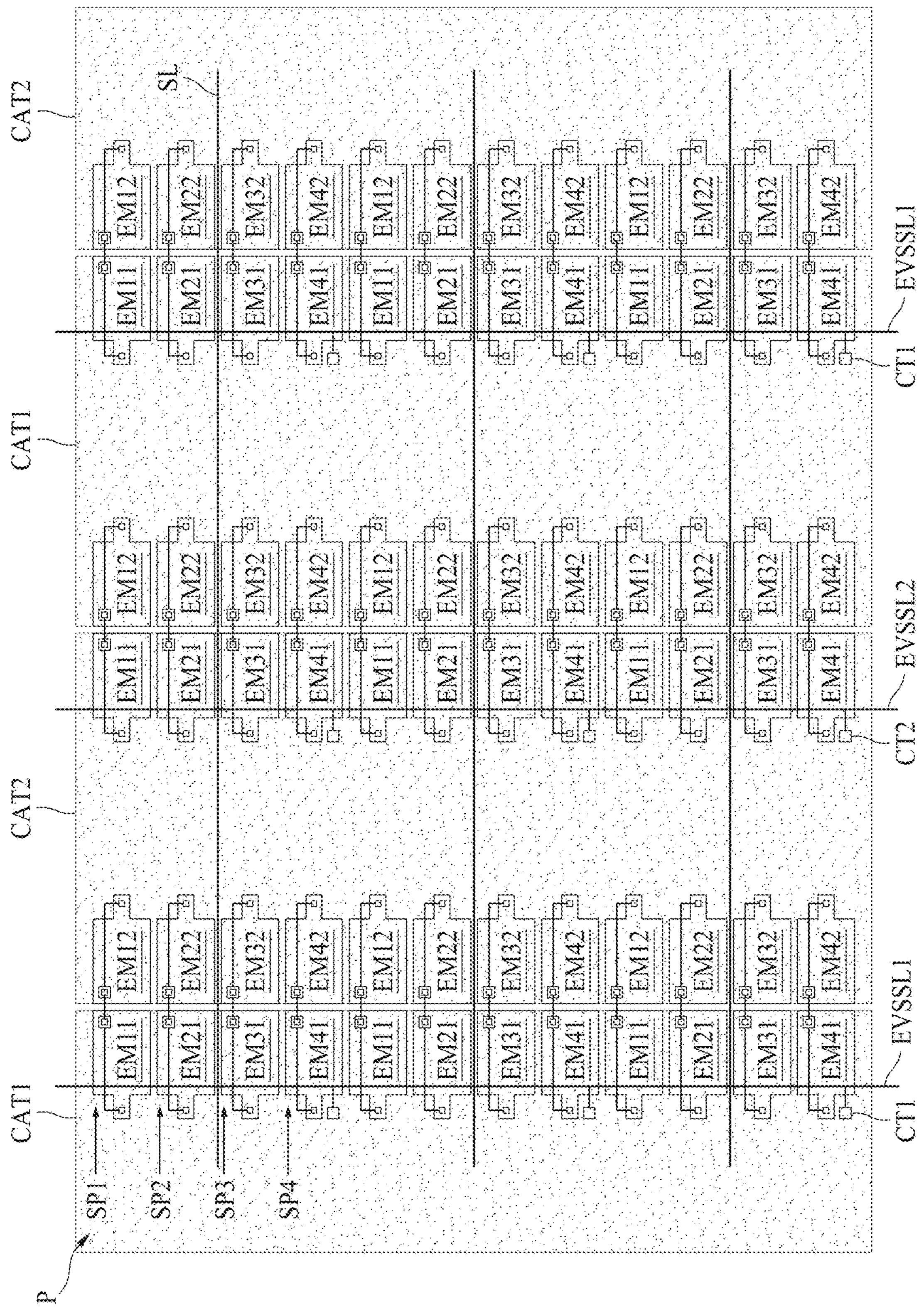
FIG. 17 is a diagram illustrating a plurality of pixels of a display device according to an embodiment of the present disclosure.

FIG. 17 is a diagram illustrating a plurality of pixels of a display device according to an embodiment of the present disclosure.

Referring to FIG. 17, each of the plurality of pixels P may include a plurality of sub-pixels SP1, SP2, SP3, and SP4. In this case, each of the plurality of sub-pixels SP1, SP2, SP3, and SP4 may include a first light emission part EM11, EM21, EM31, or EM41 and a second light emission part EM12, EM22, EM32, or EM42 disposed in the first direction X.

As described in FIG. 10, each of the plurality of sub-pixels SP1, SP2, SP3, and SP4 may include a first anode ANO1 disposed to correspond to the first light emitting parts EM11, EM21, EM31, or EM41 and a second anode ANO2 disposed to correspond to the second light emitting parts EM12, EM22, EM32, or EM42. As an example, each of the plurality of sub-pixels SP1, SP2, SP3, and SP4 discloses the first anode ANO1 and the second anode electrode ANO2 disposed in the first direction X.

In this case, the present invention discloses a plurality of first cathodes CAT1 disposed to correspond to the first anode ANO1 and a plurality of second cathodes CAT2 disposed to correspond to the second anode ANO2. As an example, the present invention discloses that the cathode has a plurality of divided regions corresponding to the arrangement structure of the divided anode electrodes rather than a single shape covering the entire display panel. As an example, the first anode ANO1 and the second first anode ANO2 are divided in the first direction X, which intersecting the second direction Y in which the first low-potential voltage line EVSSL1 and the second low-potential voltage line EVSSL2 extend. As an example, the first cathode CAT1 and the second cathode CAT2 are also divided in the first direction X.

Figure 18:
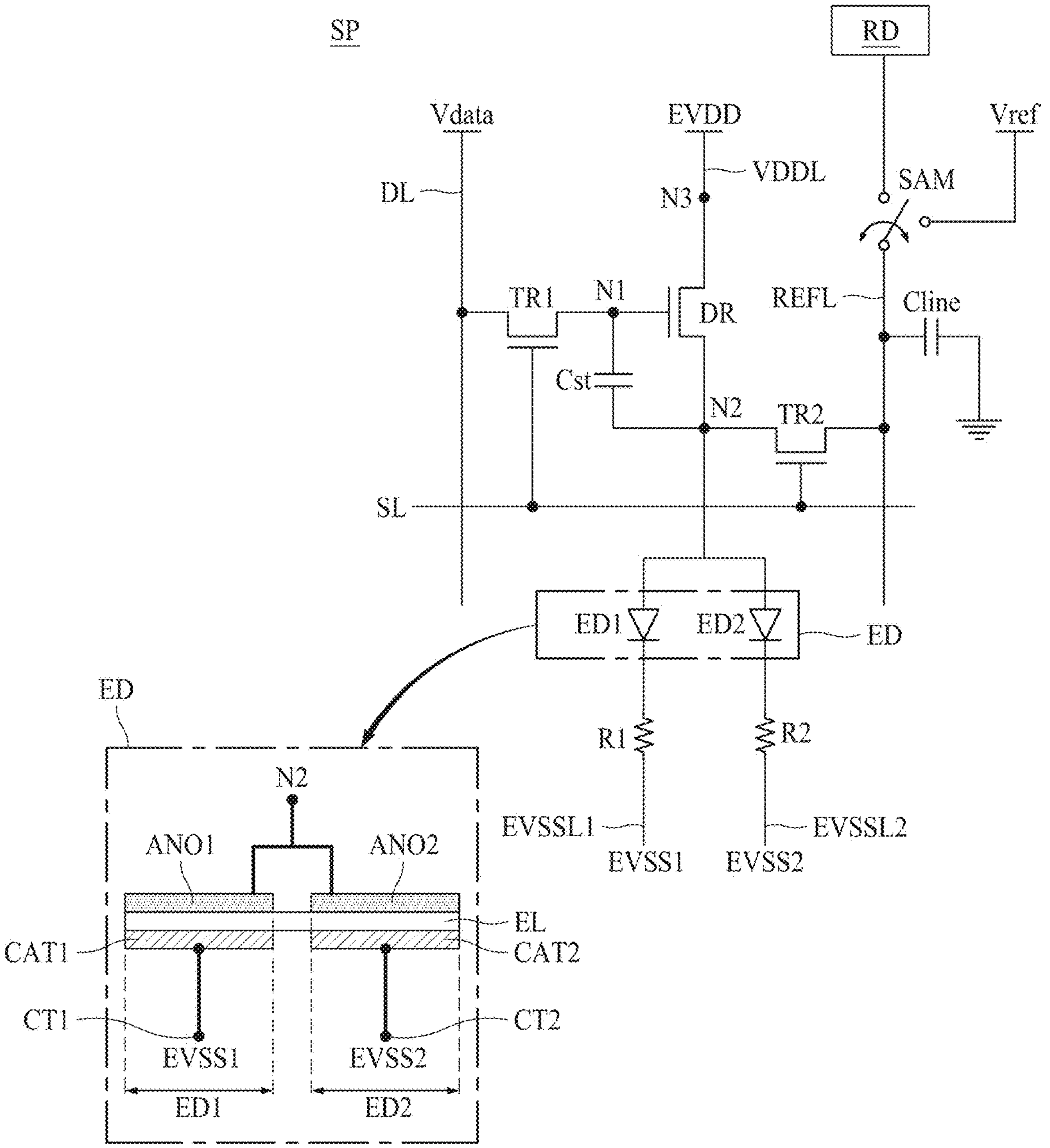
FIG. 18 is a diagram illustrating a sub-pixel and a repair detector of a display device according to an embodiment of the present disclosure.

FIG. 18 is a diagram illustrating a sub-pixel and a repair detector of a display device according to an embodiment of the present disclosure.

Referring to FIG. 18, the display device according to an embodiment of the present invention may include a repair detector RD electrically connected to a second node N2 which is a common node between the first light emitting device ED1 and the second light emitting device ED2.

As described above, the cathode CAT may include the first cathode CAT1 and the second cathode CAT2, which are separated to correspond to the first anode ANO1 and the second anode ANO2, respectively. As an example, the first anode ANO1 and the first cathode CAT1 may constitute the first light emitting device ED1, and the second anode ANO2 and the second cathode CAT2 may constitute the second light emitting device ED2.

The first low-potential voltage line EVSS1 may apply the first low-potential voltage EVSS1 to the first cathode CAT1 corresponding to the first anode ANO1, and the second low-potential voltage line EVSS2 may apply the second low-potential voltage EVSS2 to the second cathode CAT2 corresponding to the second anode ANO2.

The repair detector RD may simultaneously apply the first low-potential voltage EVSS1 and the second low-potential voltage EVSS2, respectively, to the first cathode CAT1 and the second cathode CAT2. In this case, the first low-potential voltage line EVSS1 may apply the first low-potential voltage EVSS1 to the first cathode CAT1, and the second low-potential voltage line EVSS2 may apply the second low-potential voltage EVSS2 to the second cathode CAT2.

In addition, the repair detector RD may measure a voltage transferred to the second node N2 (or the common node) between the first anode ANO1 and the second anode ANO2 through the first cathode CAT1 and the second cathode CAT2. Based on the measured voltage of the second node N2, the repair detector RD may detect whether any one of the first anode ANO1 and the second anode ANO2 is defective or short-circuited. Accordingly, the repair detector RD may detect whether any one of the first light emitting device ED1 and the second light emitting device ED2 is defective or short-circuited.

In this case, a resistance difference may occur between the first cathode CAT1, the first low-potential voltage line EVSSL1, and the first anode ANO1 and the second cathode CAT2, the second low-potential voltage line EVSSL2, and the second anode ANO2.

For example, a first resistor R1 may be formed between the first light emitting device ED1 and the first low-potential voltage line EVSSL1, and a second resistor R2 may be formed between the second light emitting device ED2 and the second low-potential voltage line EVSSL2.

The first resistor R1 may be a resistor between the first anode ANO1 and the first low-potential voltage line EVSSL1. Alternatively, the first resistor R1 may be a resistor from the first contact portion CT1 in which the first low-potential voltage line EVSSL1 is electrically connected to the cathode CAT to the first cathode CAT1 overlapping the first anode ANO1.

The second resistor R2 may be a resistor between the second anode ANO2 and the second low-potential voltage line EVSSL2. Alternatively, the second resistor R2 may be a resistor from the second contact part CT2 in which the second low-potential voltage line EVSSL2 is electrically connected to the cathode CAT to the second cathode CAT2 overlapping the second anode ANO2.

In conclusion, the repair detector RD may detect whether any one of the first anode ANO1 and the second anode ANO2 is defective or short-circuited based on the value of measured voltage of the second node N2 (or the common node) between the first anode ANO1 and the second anode ANO2 changed by the first low-potential voltage EVSS1 and the second low-potential voltage EVSS2 applied at different voltage levels, using the above-described resistance difference. Accordingly, the repair detector RD may detect whether any one of the first light emitting device ED1 and the second light emitting device ED2 is defective or short-circuited.

Figure 19:
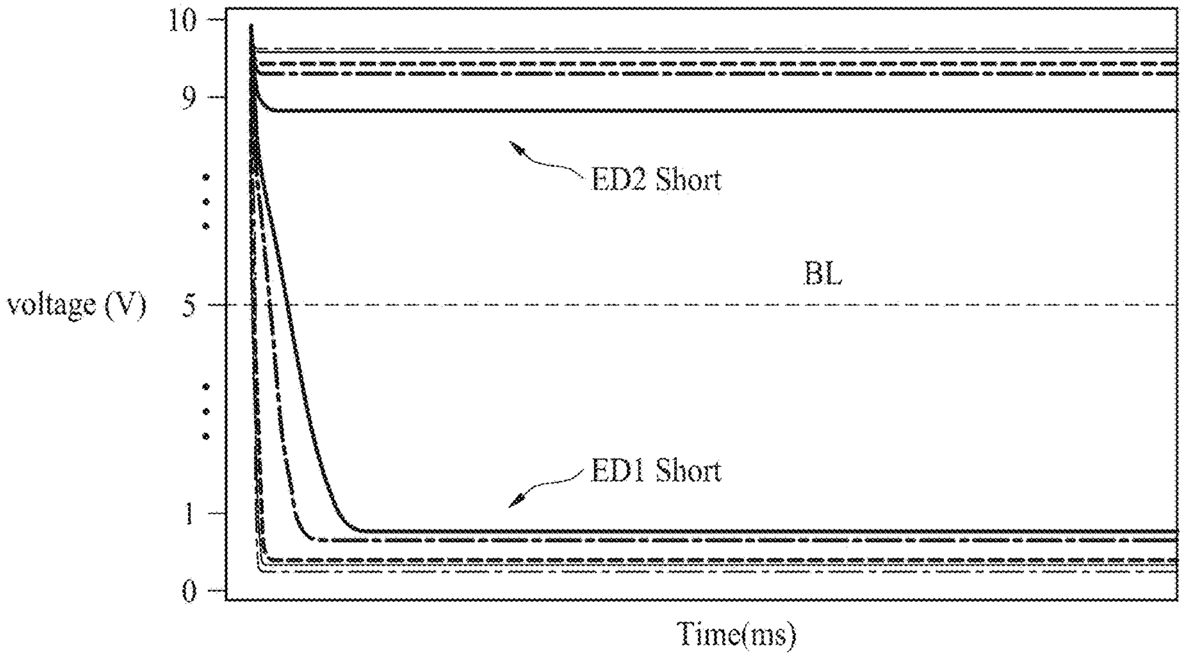
FIG. 19 is a diagram illustrating a voltage measured by a repair detector shown in FIG. 18 according to an embodiment of the present disclosure.

FIG. 19 is a diagram illustrating a voltage measured by a repair detector shown in FIG. 18 according to an embodiment of the present disclosure.

Referring to FIG. 19, when the first low-potential voltage EVSS1 is applied to 0V and the second low-potential voltage EVSS2 is applied to 10V, a defect does not occur in both the first anode ANO1 and the second anode ANO2, the value of measured voltage of the second node N2 detected through the repair detector RD may be 10V.

In addition, when a defect occurs in either the first anode ANO1 or the second anode ANO2, the value of measured voltage of the second node N2 detected through the repair detector RD may be determined according to a location where the defect occurred based on 5V.

For example, the value of measured voltage of the second node N2 detected through the repair detector RD may be between 10V and 5V or between 5V and 0V. Specifically, when a defect occurs in the first anode ANO1, a voltage adjacent to 0V may be detected, and when a defect occurs in the second anode ANO2, a voltage adjacent to 10V may be detected, but the present invention is not limited thereto.

When a defect or short circuit occurs in the first anode ANO1, the repair detector RD may detect a value of measured voltage of the second node N2 as 5 V which is the base line BL or less, and as the value adjacent to 0 V. Accordingly, the repair detector RD may determine that the defect or the short circuit occurs in the first anode ANO1. That is, the repair detector RD may determine that the defect or the short circuit occurs in the first light emitting device ED1.

When a defect or short circuit occurs in the second anode ANO2, the repair detector RD may detect a value of measured voltage of the second node N2 as 5V which is the base line BL or more, as the value adjacent to 10V. Accordingly, the repair detector RD may determine that a defect or the short circuit occurs in the second anode ANO2. That is, the repair detector RD may determine that the defect or the short circuit occurs in the second light emitting device ED2.

According to the present disclosure, the following advantageous effects may be obtained.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:

a display panel including a display area on which a plurality of sub-pixels are disposed, and a low-potential voltage supply circuit supplying a first low-potential voltage and a second low-potential voltage to the plurality of sub-pixels, wherein each of the plurality of sub-pixels includes a first light emitting part including a first light emitting device and a second light emitting part including a second light emitting device, wherein the first light emitting device and the second light emitting device share a pixel circuit, and the first light emitting device configured to receive the first low-potential voltage through a first low-potential voltage line, and the second light emitting device configured to receive the second low-potential voltage through a second low-potential voltage line, wherein the first light emitting device includes a first cathode electrically connected with the first low-potential voltage line, and the second light emitting device includes a second cathode electrically connected with the second low-potential voltage line, and wherein the first cathode and the second cathode are divided in a first direction crossing a second direction in which the first low-potential voltage line and the second low-potential voltage line extend.

2. The display device of claim 1, wherein the first low-potential voltage line and the second low-potential voltage line are alternately disposed.

3. The display device of claim 1, wherein each of the plurality of sub-pixels further includes an opening between the first light emitting part and the second light emitting part.

4. The display device of claim 3, wherein each of the plurality of sub-pixels further includes a planarization layer on which the first light emitting device and the second light emitting device are disposed, the planarization layer being divided by the opening, and wherein the planarization layer has an undercut in a side surface thereof facing the opening.

5. The display device of claim 4, wherein the planarization layer includes a lower layer and an upper layer protrudes from the lower layer toward the opening, and a side surface of the lower layer facing the opening has a reverse tapered shape, and a side surface of the upper layer facing the opening has a tapered shape.

6. The display device of claim 1, wherein each of the plurality of sub-pixels overlaps any one of the first low-potential voltage line and the second low-potential voltage line, and is non-overlapping with the other of the first low-potential voltage line and the second low-potential voltage line.

7. The display device of claim 6, wherein the plurality of sub-pixels includes a plurality of first sub-pixels and a plurality of second sub-pixels adjacent to and spaced apart from each other in a first direction, wherein each of the plurality of first sub-pixels and the plurality of second sub-pixels is arranged in a second direction that crosses the first direction, wherein the first light emitting part of the plurality of first sub-pixels overlaps the first low-potential voltage line, and the second light emitting part of the plurality of first sub-pixels is non-overlapping with the first low-potential voltage line and the second low-potential voltage line, and the first light emitting part of the plurality of second sub-pixels overlaps the second low-potential voltage line, and the second light emitting part of the plurality of second sub-pixels is non-overlapping with the first low-potential voltage line and the second low-potential voltage line.

8. The display device of claim 1, wherein the first light emitting device includes a first cathode overlapping the first low-potential voltage line, and the second light emitting device includes a second cathode overlapping the second low-potential voltage line.

9. The display device of claim 1, wherein each of the plurality of sub-pixels further includes an opening between the first light emitting part and the second light emitting part, and the first cathode and the second cathode are spaced apart from each other with the opening interposed therebetween.

10. The display device of claim 1, wherein the plurality of sub-pixels include a plurality of first sub-pixels, a plurality of second sub-pixels, and a plurality of third sub-pixels that are spaced apart in a first direction, wherein each of the plurality of first sub-pixels, the plurality of second sub-pixels, and the plurality of third sub-pixels is arranged in a second direction that crosses the first direction, wherein the first light emitting device of each of the plurality of first sub-pixels, the plurality of second sub-pixels, and the plurality of third sub-pixels overlaps different cathodes, wherein the first light emitting device of the plurality of first sub-pixels shares a first cathode, wherein the second light emitting device of the plurality of first sub-pixels and the first light emitting device of the plurality of second sub-pixels share a second cathode different from the first cathode, and wherein the second light emitting device of the plurality of second sub-pixels and the first light emitting device of the plurality of third sub-pixels share a third cathode different from the first cathode and the second cathode.

11. The display device of claim 10, wherein the first cathode, the second cathode, and the third cathode are spaced apart from each other along the first direction, and extend in the second direction.

12. The display device of claim 1, wherein the low-potential voltage supply circuit comprises:

a plurality of flexible circuit boards on which a driving integrated circuit is mounted, respectively, a first shorting bar connected to the first low-potential voltage line, and a second shorting bar connected to the second low-potential voltage line.

13. The display device of claim 12, wherein the first shorting bar includes a plurality of first connection parts connected to the plurality of flexible circuit boards and a second connection part connected to the first low-potential voltage line, and the second shorting bar includes a plurality of first connection parts connected to the plurality of flexible circuit boards and a second connection part connected to the second low-potential voltage line.

14. The display device of claim 1, wherein each of the plurality of sub-pixels includes a first sub-electrode and a second sub-electrode, wherein one side of the first sub-electrode is connected to the first light emitting device and another other side of the first sub-electrode is connected to the pixel circuit, and wherein one side of the second sub-electrode is connected to the second light emitting device and another side of the second sub-electrode is connected to the pixel circuit.

15. The display device of claim 14, wherein each of the plurality of sub-pixels includes a first sub-contact hole and a second sub-contact hole, wherein the first sub-electrode is connected to a first electrode of the first light emitting device through the first sub-contact hole, and the second sub-electrode is connected to the first electrode of the second light emitting device through the second sub-contact hole.

16. The display device of claim 15, wherein each of the plurality of sub-pixels further includes a third sub-contact hole and a fourth sub-contact hole, and the pixel circuit includes a thin film transistor, wherein the first sub-electrode is connected to a source/drain electrode of the thin film transistor through the third sub-contact hole, and the second sub-electrode is connected to the source/drain electrode of the thin film transistor through the fourth sub-contact hole.

17. The display device of claim 16, wherein each of the plurality of sub-pixels further includes an opening disposed between the first and second light emitting parts, and wherein the source/drain electrode overlaps the opening.

18. The display device of claim 1, wherein the first low-potential voltage and the second low-potential voltage is configured to have the same voltage value or different voltage values.

19. The display device of claim 1, wherein the first light emitting part and second light emitting part are configured to emit light of the same color.

20. The display device of claim 1, further comprising repair detector configured to apply the first low-potential voltage and the second low-potential voltage, respectively, to cathodes of the first light emitting device and the second light emitting device, and measure a voltage transferred to a common node between anodes of the first light emitting device and the second light emitting device.

21. A display device comprising:

a substrate including a plurality of low-potential lines and a plurality of sub-pixels, wherein each of the plurality of sub-pixels includes:

a thin film transistor on the substrate, a planarization layer on the thin film transistor, the planarization layer having an opening, and a first light emitting device and a second light emitting device on the planarization layer, wherein a first electrode of the first light emitting device and a first electrode of the second light emitting device are connected to a same thin film transistor, and a second electrode of the first light emitting device and a second electrode of the second light emitting device are spaced apart from each other, wherein the plurality of low-potential lines includes a first low-potential line and a second low-potential line, wherein the second electrode of the first light emitting device is connected to the first low-potential line, and the second electrode of the second light emitting device is connected to the second low-potential line, and wherein the second electrode of the first light emitting device and the second electrode of the second light emitting device are divided in a first direction crossing a second direction in which the first low-potential voltage line and the second low-potential voltage line extend.

22. The display device of claim 21, wherein the planarization layer includes a first planarization layer and a second planarization layer that are spaced apart from each other by the opening, wherein the first light emitting device is on the first planarization layer, and the second light emitting device is on the second planarization layer.

23. The display device of claim 22, wherein a side surface of the first planarization layer and a side surface of the second planarization layer adjacent to the opening have an undercut shape.

24. The display device of claim 21, wherein a first dummy layer and a second dummy layer are in the opening, the second dummy layer on the first dummy layer, wherein a light emitting layer of the first light emitting device, a light emitting layer of the second light emitting device, and the first dummy layer include a same material, and wherein the second electrode of the first light emitting device, the second electrode of the second light emitting device, and the second dummy layer include a same material.

25. The display device of claim 24, wherein the first dummy layer and the second dummy layer are spaced apart from the first light emitting device, and are spaced apart from the second light emitting device.

26. The display device of claim 21, further comprising:

a first passivation layer covering the first low-potential line;

a connection electrode on the first passivation layer; and a second passivation layer on the connection electrode, wherein the connection electrode and the first low-potential line contact with each other through a contact hole in the first passivation layer.

27. The display device of claim 26, wherein the second passivation layer includes a first contact portion exposing a part of an upper surface of the connection electrode, and the connection electrode and the second electrode of the first light emitting device are in contact with each other through the first contact portion.

* * * * *